(12) United States Patent
Oyama

(10) Patent No.: US 10,375,870 B2
(45) Date of Patent: Aug. 6, 2019

(54) BOARD WORK SYSTEM, AND METHOD FOR MANAGING MOUNTING ORDER OF COMPONENTS IN BOARD WORK SYSTEM

(71) Applicant: FUJI CORPORATION, Chiryu (JP)

(72) Inventor: Shigeto Oyama, Kariya (JP)

(73) Assignee: FUJI CORPORATION, Chiryu (JP)

( * ) Notice: Subject to any disclaimer, the term of this patent is extended or adjusted under 35 U.S.C. 154(b) by 311 days.

(21) Appl. No.: 15/119,082

(22) PCT Filed: Feb. 19, 2014

(86) PCT No.: PCT/JP2014/053884
§ 371 (c)(1),
(2) Date: Aug. 15, 2016

(87) PCT Pub. No.: WO2015/125226
PCT Pub. Date: Aug. 27, 2015

(65) Prior Publication Data
US 2016/0360657 A1 Dec. 8, 2016

(51) Int. Cl.
| | |
|---|---|
| *B23P 19/00* | (2006.01) |
| *H05K 3/30* | (2006.01) |
| *H05K 13/08* | (2006.01) |
| *H05K 13/04* | (2006.01) |
| *H01L 21/67* | (2006.01) |
| *H01L 23/00* | (2006.01) |

(52) U.S. Cl.
CPC ......... *H05K 13/08* (2013.01); *H05K 13/0434* (2013.01); *H05K 13/085* (2018.08);
(Continued)

(58) Field of Classification Search
CPC .. H05K 13/08; H05K 13/085; H05K 13/0434; H05K 13/0812;
(Continued)

(56) References Cited

U.S. PATENT DOCUMENTS

| | | | |
|---|---|---|---|
| 2002/0162215 A1 | 11/2002 | Kledzik | |
| 2004/0194301 A1 | 10/2004 | Kledzik | |
| 2007/0101572 A1* | 5/2007 | Kabeshita | ......... H01L 21/67132 29/832 |
| 2009/0241326 A1 | 10/2009 | Ieizumi et al. | |

FOREIGN PATENT DOCUMENTS

| | | |
|---|---|---|
| CN | 103037676 A | 4/2013 |
| EP | 2 106 207 A2 | 9/2009 |

(Continued)

OTHER PUBLICATIONS

Atsuta et al (JP 2003289200 A English Translation) Oct. 2003.*

(Continued)

*Primary Examiner* — Thiem D Phan
(74) *Attorney, Agent, or Firm* — Oblon, McClelland, Maier & Neustadt, L.L.P.

(57) ABSTRACT

A board work system which optimizes amounting order of components on a circuit board. In a case where an error rate which shows the number of defective dies included in the wafer provided in the wafer-type supply device is input by a user, an integrated control device uses the input value in processing. In addition, in a case where the error rate is not input by the user, the integrated control device decides a value obtained by averaging the number of defective dies of the same type of wafer in production information as the error rate. In addition, the system decides the mounting order of mounting the components of the tape-type supply device or the wafer-type supply device on the circuit board based on the decided error rate, or changes the mounting order after the decision.

9 Claims, 18 Drawing Sheets

(52) U.S. Cl.
CPC ........ *H01L 21/67132* (2013.01); *H01L 24/75* (2013.01); *H01L 2224/7565* (2013.01); *Y10T 29/4913* (2015.01); *Y10T 29/53174* (2015.01)

(58) Field of Classification Search
CPC ............. H01L 2224/7565; H01L 24/75; H01L 21/67132; Y10T 29/53178; Y10T 29/53174; Y10T 29/53039; Y10T 29/4913; Y10T 29/53183
USPC .......... 29/739, 709, 721, 740, 741, 832, 836
See application file for complete search history.

(56) References Cited

FOREIGN PATENT DOCUMENTS

| | | |
|---|---|---|
| JP | 2004-47927 A | 2/2004 |
| WO | WO 02/074024 A2 | 9/2002 |

OTHER PUBLICATIONS

International Search Report dated Apr. 22, 2014 in PCT/JP2014/053884 filed Feb. 19, 2014.
Extended European Search Report dated Mar. 31, 2017 in Patent Application No. 14883494.8.
Office Action dated May 3, 2018 in Chinese Patent Application No. 201480075741.4 with English translation, 13 pages.

* cited by examiner

FIG. 7

| MOUNTING ORDER OF PRINTED CIRCUIT BOARD | WAFER TYPE | WAFER ID | NUMBER OF NORMAL DIES | NUMBER OF DEFECTIVE DIES |
|---|---|---|---|---|
| FIRST | A | A-00001 | 5000 | 10 |
|  | B | B-00001 | 100 | 0 |
|  | C | C-00001 | 100 | 0 |
| SECOND | A | A-00001 | 5000 | 90 |
|  | A | A-00002 | 100 | 0 |
|  | B | B-00002 | 100 | 0 |
|  | C | C-00002 | 100 | 0 |
| ⋮ | ⋮ | ⋮ | ⋮ | ⋮ |

FIG. 8

| WAFER ID | NUMBER OF NORMAL DIES | NUMBER OF DEFECTIVE DIES | ERROR RATE (%) = NUMBER OF DEFECTIVE DIES / (NUMBER OF NORMAL DIES + NUMBER OF DEFECTIVE DIES) |
|---|---|---|---|
| A-00001 | 9900 | 100 | 1% |
| A-00002 | 9999 | 1 | 0.01% |
| A-00003 | 9000 | 1000 | 10% |
| A-00004 | 10000 | 0 | 0% |
| A-00005 | 9950 | 50 | 0.5% |
| A-00006 | 9950 | 50 | 0.5% |
| SUM | 58799 | 1201 | 2% |

FIG. 9

| Seq NUMBER | SLOT NUMBER | COMPONENT TYPE |
|---|---|---|
| 1 | 1 | WAFER COMPONENT |
| 2 | 1 | WAFER COMPONENT |
| 3 | 1 | WAFER COMPONENT |
| 4 | 1 | WAFER COMPONENT |
| 5 | 1 | WAFER COMPONENT |
| 6 | 2 | FEEDER COMPONENT |
| 7 | 2 | FEEDER COMPONENT |
| 8 | 2 | FEEDER COMPONENT |
| 9 | 2 | FEEDER COMPONENT |
| 10 | 2 | FEEDER COMPONENT |

FIG. 11

| Seq NUMBER | SLOT NUMBER | SUPPLY TIME REQUIRED WITHOUT CONSIDERING ERROR RATE (SECONDS) | CONTENT OF SUCTIONING OPERATION | OPERATION TIME (SECOND) | OCCURRENCE OF SUPPLY WAITING | TOTAL TIME REQUIRED (SECOND) |
|---|---|---|---|---|---|---|
| 1 | 1 | 2 | MOVE TO SUCTIONING POSITION OF SLOT 1 | 2 | ABSENT | 2 |
| 2 | 1 | 2 | SLOT 1 SUCTIONING→Seq 1 MOUNTING→RETURN TO NEXT SUCTIONING POSITION (SLOT 1) | 2.5 | ABSENT | 2.5 |
| 3 | 1 | 2 | SLOT 1 SUCTIONING→Seq 2 MOUNTING→RETURN TO NEXT SUCTIONING POSITION (SLOT 1) | 2 | ABSENT | 2 |
| 4 | 1 | 2 | SLOT 1 SUCTIONING→Seq 3 MOUNTING→RETURN TO NEXT SUCTIONING POSITION (SLOT 1) | 2.5 | ABSENT | 2.5 |
| 5 | 1 | 2 | SLOT 1 SUCTIONING→Seq 4 MOUNTING→RETURN TO NEXT SUCTIONING POSITION (SLOT 1) | 2.5 | ABSENT | 2.5 |
| 6 | 2 | 1 | SLOT 1 SUCTIONING→Seq 5 MOUNTING→RETURN TO NEXT SUCTIONING POSITION (SLOT 2) | 2 | ABSENT | 2 |
| 7 | 2 | 1 | SLOT 2 SUCTIONING→Seq 6 MOUNTING→RETURN TO NEXT SUCTIONING POSITION (SLOT 2) | 2 | ABSENT | 2 |
| 8 | 2 | 1 | SLOT 2 SUCTIONING→Seq 7 MOUNTING→RETURN TO NEXT SUCTIONING POSITION (SLOT 2) | 2 | ABSENT | 2 |
| 9 | 2 | 1 | SLOT 2 SUCTIONING→Seq 8 MOUNTING→RETURN TO NEXT SUCTIONING POSITION (SLOT 2) | 2 | ABSENT | 2 |
| 10 | 2 | 1 | SLOT 2 SUCTIONING→Seq 9 MOUNTING→RETURN TO NEXT SUCTIONING POSITION (SLOT 2) | 2 | ABSENT | 2 |

FIG. 12

| Seq NUMBER | SLOT NUMBER | SUPPLY TIME REQUIRED CONSIDERING ERROR RATE (SECONDS) | CONTENT OF SUCTIONING OPERATION | OPERATION TIME (SECOND) | OCCURRENCE OF SUPPLY WAITING | TOTAL TIME REQUIRED (SECOND) |
|---|---|---|---|---|---|---|
| 1 | 1 | 2.1 | MOVE TO SUCTIONING POSITION OF SLOT 1 | 2 | PRESENT | 2.1 |
| 2 | 1 | 2.1 | SLOT 1 SUCTIONING→Seq 1 MOUNTING→ RETURN TO NEXT SUCTIONING POSITION (SLOT 1) | 2.5 | ABSENT | 2.5 |
| 3 | 1 | 2.1 | SLOT 1 SUCTIONING→Seq 2 MOUNTING→ RETURN TO NEXT SUCTIONING POSITION (SLOT 1) | 2 | PRESENT | 2.1 |
| 4 | 1 | 2.1 | SLOT 1 SUCTIONING→Seq 3 MOUNTING→ RETURN TO NEXT SUCTIONING POSITION (SLOT 1) | 2.5 | ABSENT | 2.5 |
| 5 | 1 | 2.1 | SLOT 1 SUCTIONING→Seq 4 MOUNTING→ RETURN TO NEXT SUCTIONING POSITION (SLOT 1) | 2.5 | ABSENT | 2.5 |
| 6 | 2 | 1 | SLOT 1 SUCTIONING→Seq 5 MOUNTING→ RETURN TO NEXT SUCTIONING POSITION (SLOT 2) | 2 | ABSENT | 2 |
| 7 | 2 | 1 | SLOT 2 SUCTIONING→Seq 6 MOUNTING→ RETURN TO NEXT SUCTIONING POSITION (SLOT 2) | 2 | ABSENT | 2 |
| 8 | 2 | 1 | SLOT 2 SUCTIONING→Seq 7 MOUNTING→ RETURN TO NEXT SUCTIONING POSITION (SLOT 2) | 2 | ABSENT | 2 |
| 9 | 2 | 1 | SLOT 2 SUCTIONING→Seq 8 MOUNTING→ RETURN TO NEXT SUCTIONING POSITION (SLOT 2) | 2 | ABSENT | 2 |
| 10 | 2 | 1 | SLOT 2 SUCTIONING→Seq 9 MOUNTING→ RETURN TO NEXT SUCTIONING POSITION (SLOT 2) | 2 | ABSENT | 2 |

FIG. 13

| Seq NUMBER AFTER CHANGE | Seq NUMBER BEFORE CHANGE | SLOT NUMBER | SUPPLY TIME REQUIRED CONSIDERING ERROR RATE (SECOND) | CONTENT OF SUCTIONING OPERATION | OPERATION TIME (SECOND) | OCCURRENCE OF SUPPLY WAITING | TOTAL TIME REQUIRED (SECOND) |
|---|---|---|---|---|---|---|---|
| 1 | 6 | 2 | 1 | MOVE TO SUCTIONING POSITION OF SLOT 2 | 2 | ABSENT | 2 |
| 2 | 1 | 1 | 2.1→0.1 (PRECEDING OPERATION IN Seq 1 AFTER CHANGE) | SLOT 2 SUCTIONING→Seq 1 (Seq 6 BEFORE CHANGE) MOUNTING AFTER CHANGE→RETURN TO NEXT SUCTIONING POSITION (SLOT 1) | 2 | ABSENT | 2 |
| 3 | 2 | 1 | 2.1 | SLOT 1 SUCTIONING→Seq 2 MOUNTING AFTER CHANGE→ RETURN TO NEXT SUCTIONING POSITION (SLOT 2) | 2.5 | ABSENT | 2.5 |
| 4 | 7 | 2 | 1 | SLOT 2 SUCTIONING→Seq 3 MOUNTING AFTER CHANGE→ RETURN TO NEXT SUCTIONING POSITION (SLOT 1) | 2 | ABSENT | 2 |
| 5 | 3 | 1 | 2.1→0.1 (PRECEDING OPERATION IN Seq 4 AFTER CHANGE) | SLOT 1 SUCTIONING→Seq 4 MOUNTING AFTER CHANGE→ RETURN TO NEXT SUCTIONING POSITION (SLOT 1) | 2 | ABSENT | 2 |
| 6 | 4 | 1 | 2.1 | SLOT 1 SUCTIONING→Seq 5 MOUNTING AFTER CHANGE→ RETURN TO NEXT SUCTIONING POSITION (SLOT 1) | 2.5 | ABSENT | 2.5 |
| 7 | 5 | 1 | 2.1 | SLOT 1 SUCTIONING→Seq 6 MOUNTING AFTER CHANGE→ RETURN TO NEXT SUCTIONING POSITION (SLOT 2) | 2.5 | ABSENT | 2.5 |
| 8 | 8 | 2 | 1 | SLOT 2 SUCTIONING→Seq 7 MOUNTING AFTER CHANGE→ RETURN TO NEXT SUCTIONING POSITION (SLOT 2) | 2 | ABSENT | 2 |
| 9 | 9 | 2 | 1 | SLOT 2 SUCTIONING→Seq 8 MOUNTING AFTER CHANGE→ RETURN TO NEXT SUCTIONING POSITION (SLOT 2) | 2 | ABSENT | 2 |
| 10 | 10 | 2 | 1 | SLOT 2 SUCTIONING→Seq 9 MOUNTING AFTER CHANGE→ RETURN TO NEXT SUCTIONING POSITION (SLOT 2) | 2 | ABSENT | 2 |

FIG. 15

| MODULE NAME | M1 | M2 | M3 | M4 | M5 | | | | M6 | M7 | SYSTEM |
| --- | --- | --- | --- | --- | --- | --- | --- | --- | --- | --- | --- |
| | | | | | FEEDER COMPONENT | WAFER COMPONENT | | SUM OF M5 | | | |
| PRODUCTION TIME WITHOUT CONSIDERING ERROR TIME (SECONDS) | 10 | 8 | 10 | 10 | 2 | 8 | | 10 | 10 | 10 | 10 |
| PRODUCTION TIME CONSIDERING ERROR TIME (SECONDS) | 10 | 8 | 10 | 10 | 2 | 9 | | 11 | 10 | 10 | 11 |
| PRODUCTION TIME AFTER OPTIMIZATION (SECONDS) | 10 | 9 | 10 | 10 | 1 | 9 | | 10 | 10 | 10 | 10 |

FIG. 17

| WAFER TYPE | WAFER ID | NUMBER OF NORMAL DIES | NUMBER OF DEFECTIVE DIES | SET VALUE OF ERROR RATE |
|---|---|---|---|---|
| A | A-00001 | 9900 | 100 | USER DESIGNATION |
| A | A-00002 | 9999 | 1 | USER DESIGNATION |
| A | A-00003 | 9000 | 1000 | USER DESIGNATION |
| A | A-00004 | 10000 | 0 | USER DESIGNATION |
| A | A-00005 | 9950 | 50 | USER DESIGNATION |
| A | A-00006 | 9950 | 50 | PRODUCTION INFORMATION |
| A | A-00007 | 9950 | 50 | PRODUCTION INFORMATION |
| ⋮ | ⋮ | ⋮ | ⋮ | ⋮ |

BOARD WORK SYSTEM, AND METHOD FOR MANAGING MOUNTING ORDER OF COMPONENTS IN BOARD WORK SYSTEM

TECHNICAL FIELD

The present application relates to a board work system provided with a die supply section which supplies dies that are formed by dicing a wafer, and a method for managing a mounting order of mounting components on a circuit board in the board work system.

BACKGROUND ART

In a board work system which mounts components on a circuit board, there is a system which is provided with a plurality of component supply sections which supply the components for mounting different types of components on the circuit board (PTL 1 or the like). In a board work system disclosed in PTL 1, a component supply section which supplies dies that are formed by dicing a wafer, is provided. In the component supply section, for example, the die adhered to a predetermined position on a dicing sheet is suctioned by reverse transfer means, and reverses the position of the suctioned die to that the die is upside down. The component supply section transfers the die reversed by the reverse transfer means to a position at which the die can be suctioned by a suction nozzle of a mounting head. In addition, the board work system moves the mounting head in which the die is suctioned by the suction nozzle, and mounts the die on the circuit board.

CITATION LIST

Patent Literature

PTL 1: JP-A-2004-47927

SUMMARY

However, in the above-described wafer, in a case where a defective die (bad die) is present in a die assembly adhered to the dicing sheet, for example, a mark which shows that the die is defective on an upper surface of the defective die, is added. The component supply section detects the mark added based on imaging data of a die camera, and determines the defective die. In addition, the component supply section searches for a normal die instead of a detected defective die. Therefore, in this type of component supply section, component supply time which is required until the normal die can be supplied varies in accordance with the number of defective dies included in the die assembly.

In addition, in the board work system, there is a case where one component mounting machine is provided with the plurality of component supply sections which supply the die, or a case where the component supply section which supplies the dies and other component supply sections (component supply section provided with a tape feeder, or the like) are loaded together. In the component mounting machine provided with the plurality of component supply sections, there is a requirement that each component supply section desirably and accurately manages time for supplying the component. This is because the mounting order can be optimized and the production time can be reduced by deciding the mounting order of various types of components to the circuit board after accurately managing the component supply time. Therefore, a board work system which can accurately manage the above-described component supply time of the component supply section which supplies the dies, and can optimize the mounting order of the components, is desirable.

Considering the above-described problem, an object of the present disclosure is to provide a board work system which can improve the production efficiency by optimizing the mounting order of the components on the circuit board, and a method for managing the mounting order of the components of the board work system.

A board work system according to a technology disclosed in the disclosure which considers the above-described problem includes: a plurality of component supply sections which supply components to be mounted on a circuit board; a die supply section which is one of the plurality of component supply sections, and supplies dies from a diced wafer; and a control section which decides or changes a mounting order of mounting the components including the dies on the circuit board, based on an error occurrence rate decided based on at least one of the number of defective dies which the die supply section has tried to supply within a predetermined period during production of the plurality of circuit boards, and data related to the defective die included in the wafer.

In addition, a method for managing a mounting order of components in a board work system including a plurality of component supply sections which supply the components to be mounted on a circuit board; and a die supply section which is one of the plurality of component supply sections, and supplies dies from a diced wafer, the method according to a technology disclosed in the disclosure which considers the above-described problem includes: deciding or changing a mounting order of mounting the components including the dies on the circuit board, based on an error occurrence rate decided based on at least one of the number of defective dies which the die supply section has tried to supply within a predetermined period during production of the plurality of circuit boards, and data related to the defective dies included in the wafer.

Advantageous Effects

According to the technology disclosed in the disclosure, it is possible to provide a board work system which can improve production efficiency by optimizing a mounting order of components on a circuit board, and a method for managing the mounting order of the component in the board work system.

BRIEF DESCRIPTION OF DRAWINGS

FIG. 7 is a part of production information, and a view illustrating the numbers of normal dies and defective dies of a wafer, which are used in each production order of a printed circuit board.

FIG. 8 is a view illustrating the number of normal dies and the number of defective dies of a wafer type "A".

FIG. 9 is a view illustrating a supply order of the components in the electronic component mounting machine before optimization.

FIG. 11 is a view illustrating data which is data related to component supply time, and which is data before considering an error occurrence rate.

FIG. 12 is a view illustrating data which is the data related to the component supply time, and which is data after considering the error occurrence rate.

FIG. 13 is a view illustrating data after optimizing the data illustrated in FIG. 12.

FIG. 15 is a view for comparing production time of each module.

FIG. 17 is a view illustrating the number of normal dies and the number of defective dies in each wafer.

DESCRIPTION OF EMBODIMENTS

First Embodiment

Figure 1:
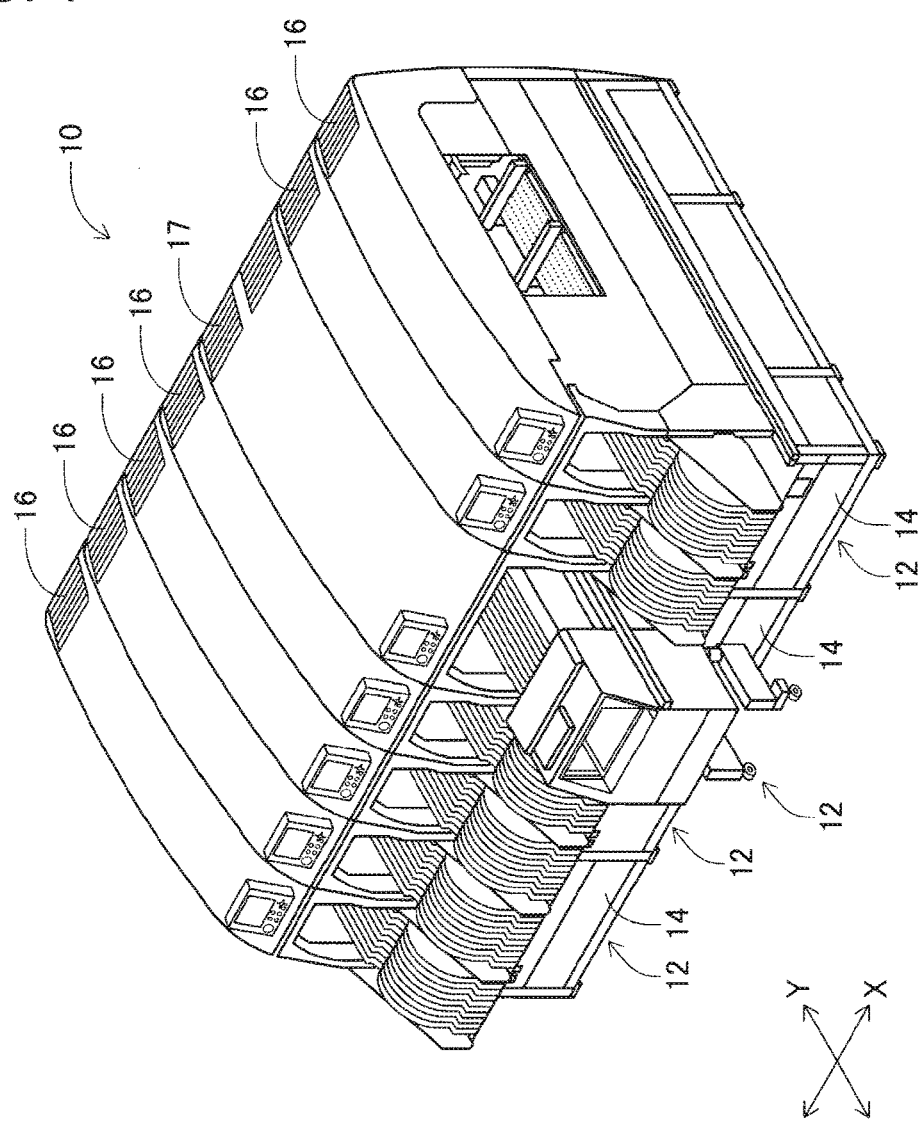
FIG. 1 is a perspective view illustrating a board work system of a first embodiment.

Hereinafter, one embodiment which specifies the present disclosure will be described with reference to the drawings. FIG. 1 illustrates a board work system of a first embodiment. A board work system (hereinafter, there is a case of being simply called "system") 10 illustrated in FIG. 1 performs work of mounting electronic components on a circuit board, and is configured of four electronic component mounting devices 12 installed to be adjacent to each other. The electronic component mounting device 12 is configured to include one system base 14, two electronic component mounting machines 16 installed to be adjacent to each other on the system base 14, and an electronic component mounting machine 17 in which the width of the electronic component mounting device 12 in the installation direction is 2 times that of the electronic component mounting machine 16. In other words, seven electronic component mounting machines 16 and 17 are arranged in order. In addition, in the following description, the direction in which the electronic component mounting machines 16 and 17 are aligned is referred to as the X-axis direction, and the horizontal direction perpendicular to the X-axis direction is referred to as the Y-axis direction.

Figure 2:
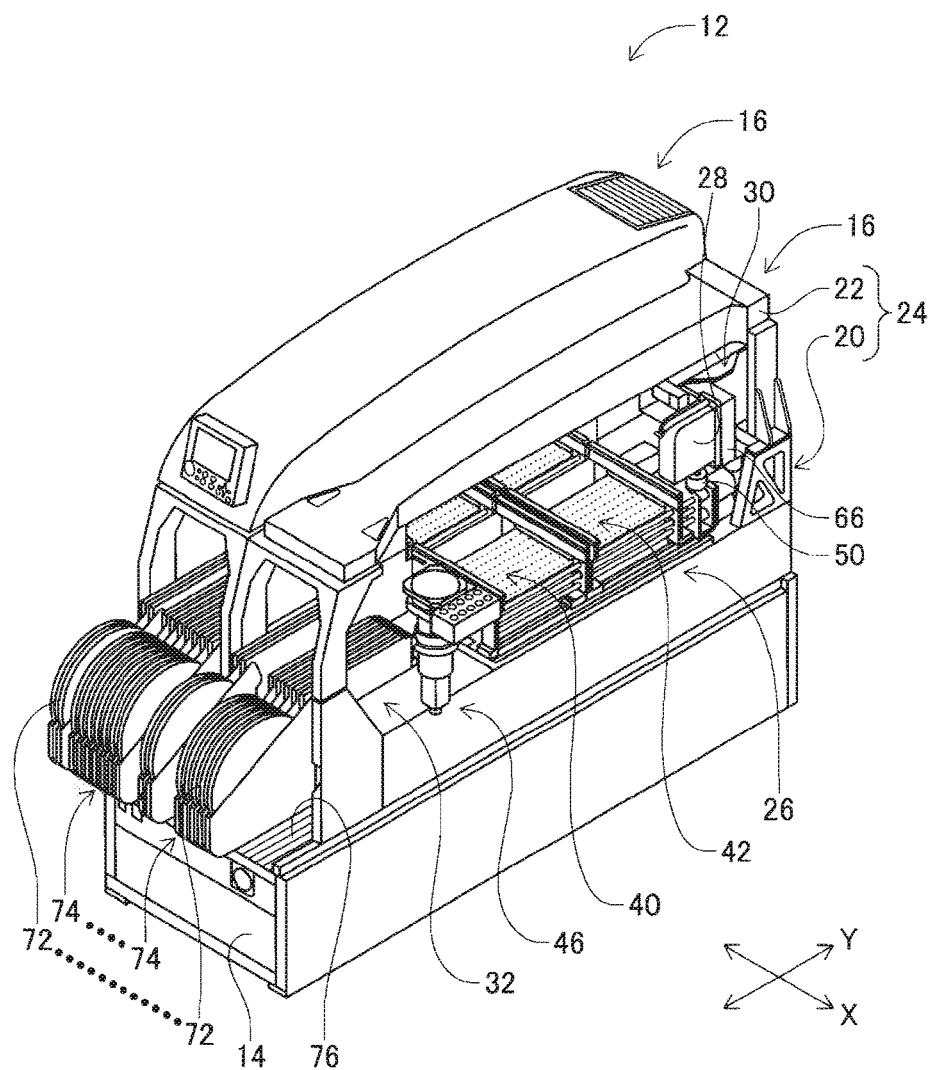
FIG. 2 is a perspective view illustrating an electronic component mounting device which configures the board work system illustrated in FIG. 1.

Among four electronic component mounting devices 12 which configure the system 10, since three electronic component mounting devices 12 in which two electronic component mounting machines 16 are installed are configured similar to each other, one electronic component mounting device 12 among these is illustrated in FIG. 2, and the one electronic component mounting device 12 is described as a representative example. In other words, FIG. 2 is a perspective view except for a part of an exterior component of the electronic component mounting device 12. Each electronic component mounting machine 16 provided in the electronic component mounting device 12 mainly includes a mounting machine main body 24 including a frame section 20 and a beam section 22 constructed on the frame section 20, a conveyance device 26 which conveys the circuit board in the X-axis direction, and secures the circuit board at a set position, a mounting head 28 which mounts the electronic components on the circuit board secures by the conveyance device 26, a moving device 30 which is installed in the beam section 22 and moves the mounting head 28 in the X-axis direction and in the Y-axis direction, and a supply device 32 which is installed in front of the frame section 20, and supplies the electronic components to the mounting head 28.

The conveyance device 26 is provided with two conveyors 40 and 42, and the two conveyors 40 and 42 are installed in a center portion of the frame section 20 in the Y-axis direction to be parallel to each other and extend in the X-axis direction. Each of the two conveyors 40 and 42 has a structure of conveying the circuit board supported by each of the conveyors 40 and 42 by an electromagnetic motor (not illustrated) in the X-axis direction. Furthermore, each of the conveyors 40 and 42 has a structure in which a board holding device (not illustrated) is provided, and the circuit board is held to be secured at a predetermined position.

In addition, the mounting head 28 mounts the electronic component on the circuit board held by the conveyance device 26, and has a suction nozzle 50 which suctions the electronic component on a lower surface. In addition, in the mounting head 28, a mark camera 44 (refer to FIG. 3) is fixed in a state of being oriented downward, and the mark camera 44 captures an image of a reference position mark of the circuit board, an ID mark which identifies the circuit board, or a mounting state of the electronic component. The suction nozzle 50 has a structure of passing through a positive and negative pressure supply device (refer to FIG. 5) via a negative pressure air passage and a positive pressure air passage, suctioning and holding the electronic component by negative pressure, and disengaging the held electronic component by supplying slightly positive pressure. Furthermore, the mounting head 28 has a nozzle lifting and lowering device 54 (refer to FIG. 5) which raises and lowers the suction nozzle 50, and a nozzle rotation device 55 (refer to FIG. 5) which rotates the suction nozzle 50 around the axis thereof, and can change the position of the held electronic component in the vertical direction and the holding posture of the electronic component. In addition, the suction nozzle 50 can be attached to and detached from the mounting head 28, and can be changed in accordance with the size and the shape of the electronic component.

The moving device 30 moves the mounting head 28 to an arbitrary position on the frame section 20, and is provided with an X-axis direction slide mechanism (not illustrated) for moving the mounting head 28 in the X-axis direction, and a Y-axis direction slide mechanism (not illustrated) for moving the mounting head 28 in the Y-axis direction. The Y-axis direction slide mechanism includes a Y-axis slider 60 (refer to FIG. 3) provided in the beam section 22 to be movable in the Y-axis direction, and an electromagnetic motor 57 (refer to FIG. 5) which serves as a driving source, and the Y-axis slider 60 can be moved to an arbitrary position in the Y-axis direction by the electromagnetic motor 57. In addition, the X-axis direction slide mechanism includes an X-axis slider 66 provided in the Y-axis slider to be movable in the X-axis direction, and an electromagnetic motor 58 (refer to FIG. 5) which serves as a driving source, and the X-axis slider 66 can be moved to an arbitrary position in the X-axis direction by the electromagnetic motor 58. In addition, as the mounting head 28 is attached to the X-axis slider 66, the mounting head 28 can be moved to the arbitrary position on the frame section 20 by the moving device 30. In addition, the mounting head 28 can be attached to and detached from the X-axis slider 66 with one touch, and can be exchanged with different types of work heads, for example, to a dispenser head or an inspection head.

In addition, on the upper surface of the frame section 20 which serves as a base, a part camera 46 is provided between the conveyance device 26 and the supply device 32 in the Y-axis direction. The part camera 46 is a camera for performing capturing an image when the mounting head 28 in which the electronic components are suctioned and held passes through the upper portion, and for confirming a suctioned state by captured data.

In addition, the supply device 32 is installed in an end portion on the front side of the frame section 20, and is a feeder-type supply device. The supply device 32 has a structure in which a plurality of tape feeders 74 which accommodate taped components made by taping the electronic component in a state of being wound around a reel 72, and a plurality of feed devices (not illustrated) which send out the taped components accommodated in each of the plural tape feeders 74, are provided, and the electronic components are consecutively supplied to the supply position from the taped component to the mounting head 28. The tape feeder 74 can be attached to and detached from a device pallet 76 attached to the end portion on the front side of the frame section 20, and can correspond to replacement of the electronic component. In addition, the device pallet 76 to which and from which the tape feeder 74 is attached and detached, can be attached to and detached from the frame section 20 by an operation of a clamp mechanism (not illustrated) provided in the frame section 20. Therefore, the electronic component mounting machine 16 can detach the device pallet 76 from the frame section 20, and can attach a supply device different from the feeder-type supply device 32 to the frame section 20.

Figure 3:
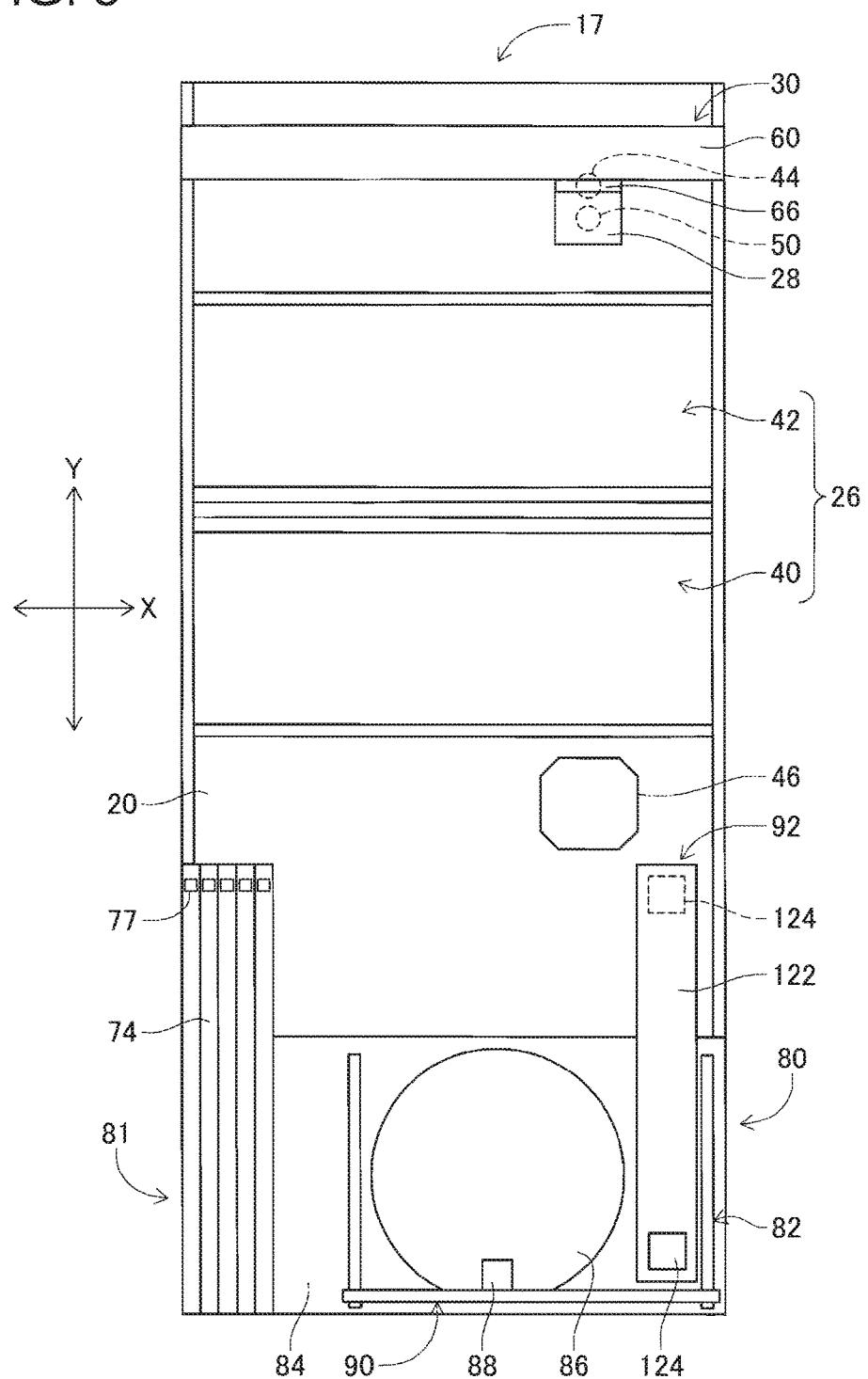
FIG. 3 is a plan view when an electronic component mounting machine is viewed from above.

FIG. 3 is a plan view when the electronic component mounting machine 17 provided in the electronic component mounting device 12 is viewed from above. The electronic component mounting device 12 provided with the electronic component mounting machine 17 is configured similar to the electronic component mounting device 12 provided with the electronic component mounting machine 16 except that the widths of the frame section 20, the conveyance device 26, and the Y-axis slider 60 which are provided in the electronic component mounting machine 17 in the X-axis direction are approximately 2 times the widths of the frame section 20, the conveyance device 26, and the Y-axis slider 60 which are provided in the electronic component mounting machine 16. In the following description, configuration elements of the electronic component mounting machine 17 which are common to those of the electronic component mounting machine 16 use the same reference numerals, and the description thereof will be appropriately omitted. The electronic component mounting machine 17 illustrated in FIG. 3 illustrates a state where the device pallet 76 in which the width is approximately 2 times greater is detached from the frame section 20, and a supply device 80 which is different from the feeder-type supply device 32 is attached to the frame section 20. The supply device 80 is a mixed type supply device provided with a tape-type supply device 81 and a wafer-type supply device 82. In the following description, the electronic component mounting machine 17 illustrated in FIG. 3 in which the mixed type supply device 80 is attached to the frame section 20 will be described.

The tape-type supply device 81 is provided with a feed device which sends out the above-described plural tape feeders 74 or electronic components 77 which became the tape of the tape feeder 74. The wafer-type supply device 82 also supplies dies 108 from a die assembly 106 (refer to FIG. 4) which is made by dicing the wafer to which a dicing sheet is adhered. The tape-type supply device 81 and the wafer-type supply device 82 of the supply device 80 are attached to the front surface side of the frame section 20 of the electronic component mounting machine 17.

The wafer-type supply device 82 is loaded on a loading plate 84. The wafer-type supply device 82 is provided with a die assembly holding device 86 which is installed at the substantial center of the loading plate 84, and holds the die assembly 106 to be fixed, a pick-up head 88 which picks up the die 108 from the die assembly 106 held by the die assembly holding device 86, a head moving device 90 which moves the pick-up head 88 to an arbitrary position on the loading plate 84, and a shuttle mechanism 92 which carries the die 108 picked up by the pick-up head 88 to the supply position.

Figure 4:
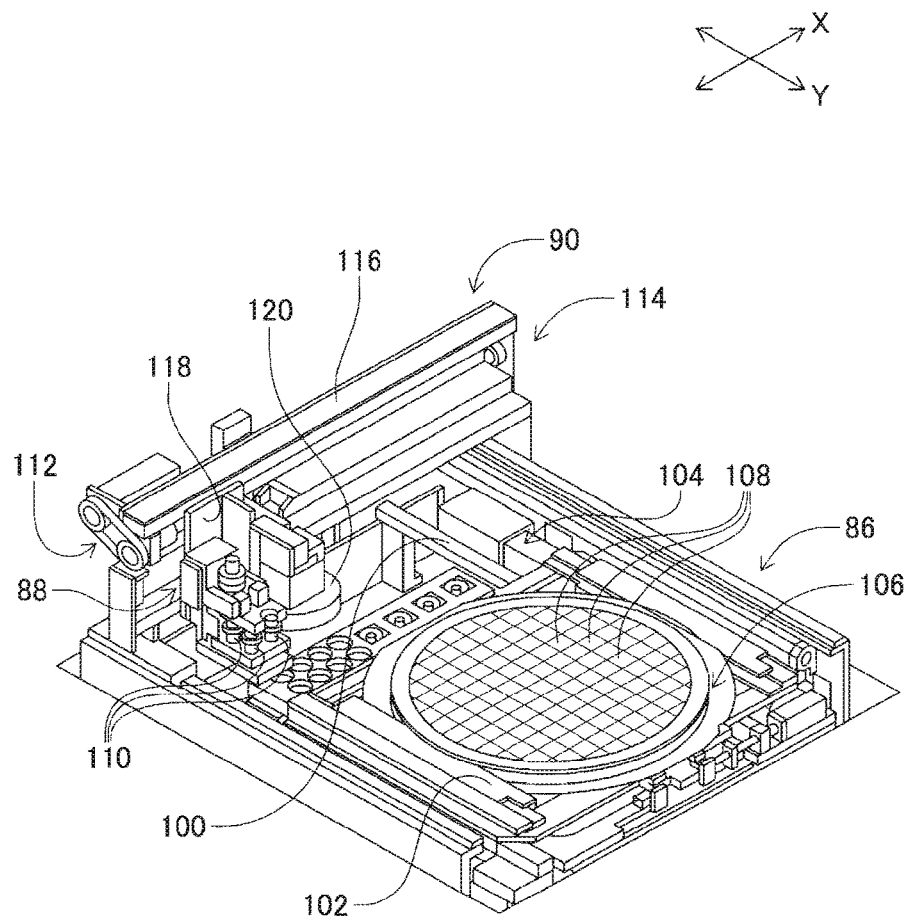
FIG. 4 is a perspective view illustrating a die supply machine.

As illustrated in FIG. 4, the die assembly holding device 86 includes one pair of guide rails (only one is illustrated in the drawing) 100 installed to extend in the Y-axis direction, a holding frame 102 which is held to be movable in the Y-axis direction by the one pair of guide rails 100, and a frame moving mechanism 104 which moves the holding frame 102 in the Y-axis direction. In the die assembly holding device 86, the die assembly 106 held on the holding frame 102 is moved in the Y-axis direction by the frame moving mechanism 104.

In addition, the pick-up head 88 is provided with a plurality of holding rods 110 which holds the suction nozzle (not illustrated) for suctioning the die 108 at a lower end portion. The suction nozzle held by each holding rod 110 has a structure of passing through a negative pressure supply device (not illustrated) via an air passage, and suctioning and holding the die 108 by the negative pressure.

In addition, the head moving device 90 is an XY robot-type moving device, and can move the pick-up head 88 to the arbitrary position on the die assembly holding device 86. Specifically, the head moving device 90 is provided with a Y-axis direction slide mechanism 112 for moving the pick-up head 88 in the Y-axis direction, and an X-axis direction slide mechanism 114 for moving the pick-up head 88 in the X-axis direction. The Y-axis direction slide mechanism 112 includes a Y-axis direction slider 116 provided to be movable in the Y-axis direction, and an electromagnetic motor (not illustrated) which serves as a driving source. In the Y-axis direction slide mechanism 112, as the electromagnetic motor is driven, the Y-axis direction slider 116 is movable to an arbitrary position in the Y-axis direction. In addition, the X-axis direction slide mechanism 114 includes an X-axis direction slider 118 provided on a side surface of the Y-axis direction slider 116 to be movable in the X-axis direction, and an electromagnetic motor (not illustrated) which serves as a driving source. In the X-axis direction slide mechanism 114, as the electromagnetic motor is driven, the X-axis direction slider 118 is movable to an arbitrary position in the X-axis direction. In addition, as the pick-up head 88 is attached to the X-axis direction slider 118, the pick-up head 88 is movable to an arbitrary position on the die assembly holding device 86 by the head moving device 90.

In the X-axis direction slider 118 to which the pick-up head 88 is attached, a die camera 120 is provided in a state of being oriented downward, and as the X-axis direction slider 118 is moved by the head moving device 90, it is possible to capture an image of the die assembly 106 held by the die assembly holding device 86 at an arbitrary position. Accordingly, it is possible to obtain each positional information or the like of the plurality of dies 108 of the die assembly 106.

In addition, as illustrated in FIG. 3, the shuttle mechanism 92 is fixed onto the loading plate 84 on one side in the X-axis direction with respect to the die assembly holding device 86. The shuttle mechanism 92 is configured of a generally longitudinal shuttle main body 122, and a die conveyance table 124 provided on an upper surface of the shuttle main body 122. The die conveyance table 124 can slide in the longitudinal direction of the shuttle main body 122. The die conveyance table 124 receives the die 108 from the pick-up head 88, conveys the received die 108 to the supply position, and includes a shuttle nozzle (not illustrated) for receiving the die 108. In addition, the shuttle main body 122 is fixed to the upper surface of the loading plate 84 at a part on a base end side and extends in the Y-axis direction, and a part on the tip end side of the shuttle main body 122 extends from the loading plate 84. Accordingly, the part on the tip end side of the shuttle mechanism 92 extends on the frame section 20 in a state where the supply device 80 is attached to the electronic component mounting machine 17. In addition, the supply device 80 is provided with a connector (not illustrated) which is electrically connected to the frame section 20 of the electronic component mounting machine 17 on a lower surface of the loading plate 84. In addition, in the die 108, according to the type, a die (for example, a flip chip) adhered to the dicing sheet upside down, is present. Therefore, the wafer-type supply device 82 may be provided with a reverse unit which receives the die 108 picked up by the pick-up head 88, and supplies the dies 108 to the die conveyance table 124 upside down as necessary.

Figure 5:
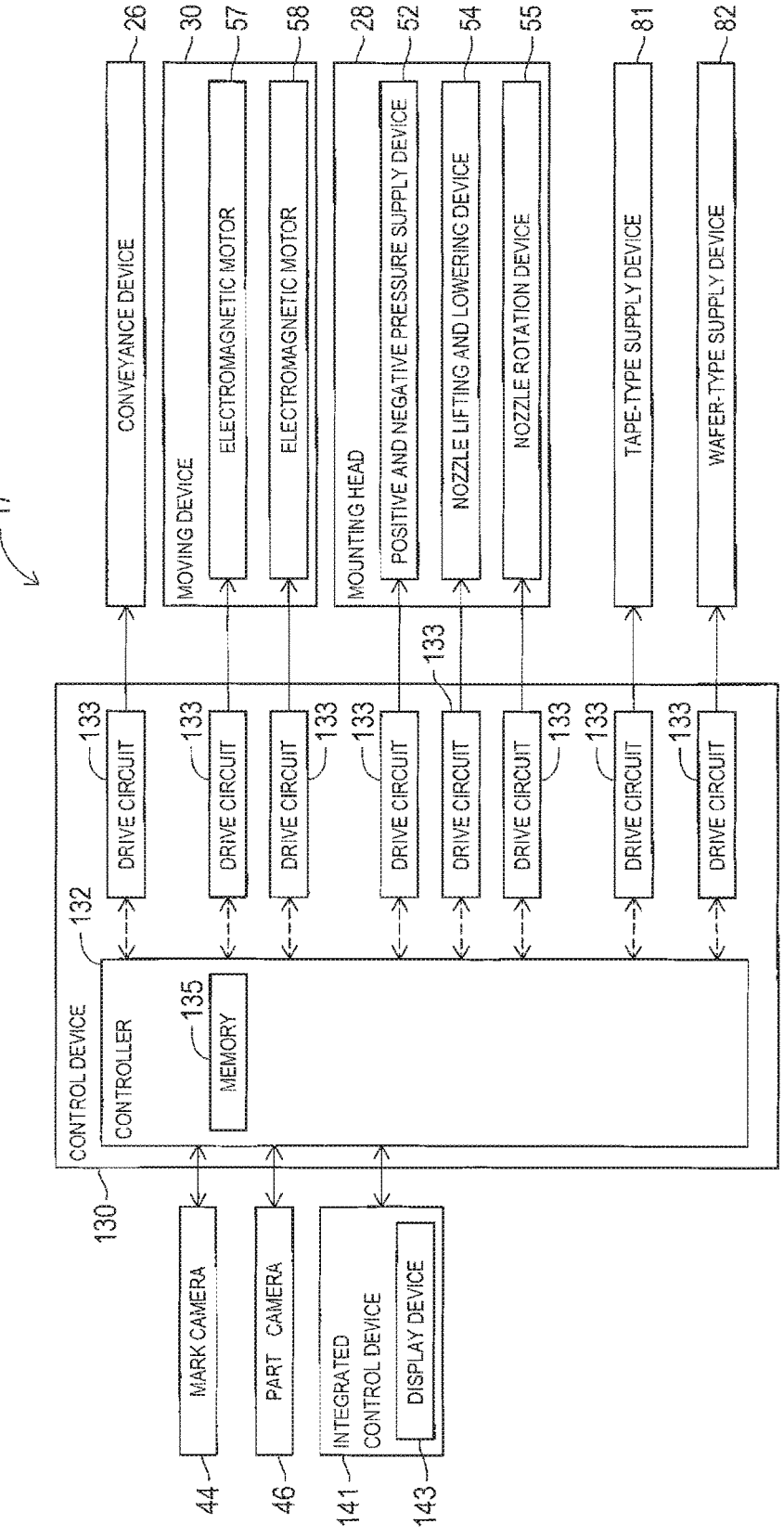
FIG. 5 is a block diagram of the electronic component mounting machine.

As illustrated in FIG. 5, a control device 130 of the electronic component mounting machine 17 is provided with a controller 132 in which a computer provided with a CPU, a ROM, or a RAM, is considered as a main body, and a plurality of drive circuits 133 which correspond to each of the conveyance device 26, the electromagnetic motors 57 and 58 of the moving device 30, the positive and negative pressure supply device 52, the nozzle lifting and lowering device 54, the nozzle rotation device 55, the tape-type supply device 81, and the wafer-type supply device 82. The controller 132 can control operations of the conveyance device 26 and the moving device 30 or the like via each drive circuit 133. In addition, the controller 132 processes image data captured by the mark camera 44 and the part camera 46. The controller 132 processes the image data obtained by the mark camera 44, and detects the information related to the circuit board. In addition, the controller 132 detects and corrects an error or the like of the held position of the component (the die 108 or the electronic component 77) by the suction nozzle 50 based on the processing result of the image data obtained by the part camera 46 and position information data stored in a memory 135. In addition, the controller 132 is connected to an integrated control device 141 of the system 10, and sends and receives the detection result or command between the controller 132 and the integrated control device 141. The integrated control device 141 is provided with a display device 143, such as a touch panel, and receives an input of various types of information, and displays various types of information so that a user can confirm various types of information.

The wafer-type supply device 82 picks up the die 108 from the die assembly 106 by the pick-up head 88 based on the control of the control device 130. In addition, by conveying the picked-up die 108 to the supply position by the shuttle mechanism 92, the wafer-type supply device 82 can supply the die 108 to the mounting head 28. Specifically, first, the control device 130 controls the head moving device 90, and moves the die camera 120 to the upper part of the die 108 to be picked up among the plurality of dies 108 of the die assembly 106 held by the die assembly holding device 86. The control device 130 captures an image of the die 108 by the die camera 120, and obtains the positional information of the die 108 based on the captured data.

Next, the control device 130 controls the head moving device 90 based on the obtained positional information of the die 108, and moves the pick-up head 88 to the upper part of the die 108 to be picked up. The control device 130 lowers the holding rod 110 of the pick-up head 88. The suction nozzle of the holding rod 110 suctions and holds the die 108, and picks up the die 108 from the die assembly 106. In addition, below the die assembly holding device 86, a pushing-up mechanism (not illustrated) which pushes up the die 108 from below is provided, and when suctioning the die 108 by the suction nozzle, as the die 108 is pushed upward by the pushing-up mechanism, the pick-up of the die 108 is supported.

Next, the control device 130 moves the pick-up head 88 which picked up the die 108, to the upper part of the die conveyance table 124 of the shuttle mechanism 92. In addition, when the die 108 is picked up by the pick-up head 88, the die conveyance table 124 becomes a position (position at which the die conveyance table 124 is illustrated by a solid line in FIG. 3) on the base end portion side of the shuttle main body 122. In addition, by lowering the holding rod 110 of the pick-up head 88, and by stopping the supply of the negative pressure to the suction nozzle, the control device 130 delivers the picked-up die 108 to the shuttle nozzle of the die conveyance table 124.

The die conveyance table 124 which receives the die 108 is slid toward the tip end portion from the base end portion of the shuttle main body 122 by the control device 130, and enters a state of supplying the die 108 at the position (position at which the die conveyance table 124 is illustrated by a dotted line in FIG. 3) on the tip end portion side of the shuttle main body 122. In other words, the position at which the die conveyance table 124 is illustrated by a dotted line in FIG. 3, is a supply position of the die 108 by the wafer-type supply device 82, and the supplied die 108 at the position is held by the mounting head 28.

Meanwhile, in a case where the electronic component 77 is supplied from the tape feeder 74, the control device 130 controls the tape-type supply device 81, and controls consecutive supply of the electronic component 77 to the supply position (tip end part of the tape feeder 74 of FIG. 3) from the taped component accommodated in each of the plural tape feeders 74 to the mounting head 28.

Here, in the supply device of supplying the die 108 similar to the wafer-type supply device 82, in a case where a defective die (bad die) is present in the die assembly 106, for example, it is necessary to detect a mark which shows that the die is defective on the upper surface of the defective die, based on the captured data by the die camera 120. In addition, in the wafer-type supply device 82, processing of searching for the normal die 108 instead of the detected defective die, becomes necessary. Therefore, in the wafer-type supply device 82, the component supply time which becomes necessary until supplying the normal die 108 varies in accordance with the number of defective dies included in the die assembly 106 on the dicing sheet. Here, in each of the electronic component mounting machines 16 and 17, with respect to the electronic component mounting machine 17 provided with the wafer-type supply device 82, the system 10 of the embodiment decides an error occurrence rate (hereinafter, simply referred to as "error rate") obtained by detecting the defective die from the die assembly 106, and corrects the component supply time based on the error rate. Furthermore, the system 10 optimizes a mounting order of mounting the components on the circuit board by each of the electronic component mounting machine 16 and the electronic component mounting machine 17, based on the component supply time after the correction. The system 10 performs optimizing processing of the mounting order, for example, by performing a production job and by producing a predetermined printed circuit board.

Optimizing Processing of Mounting Order of Components

Figure 6:
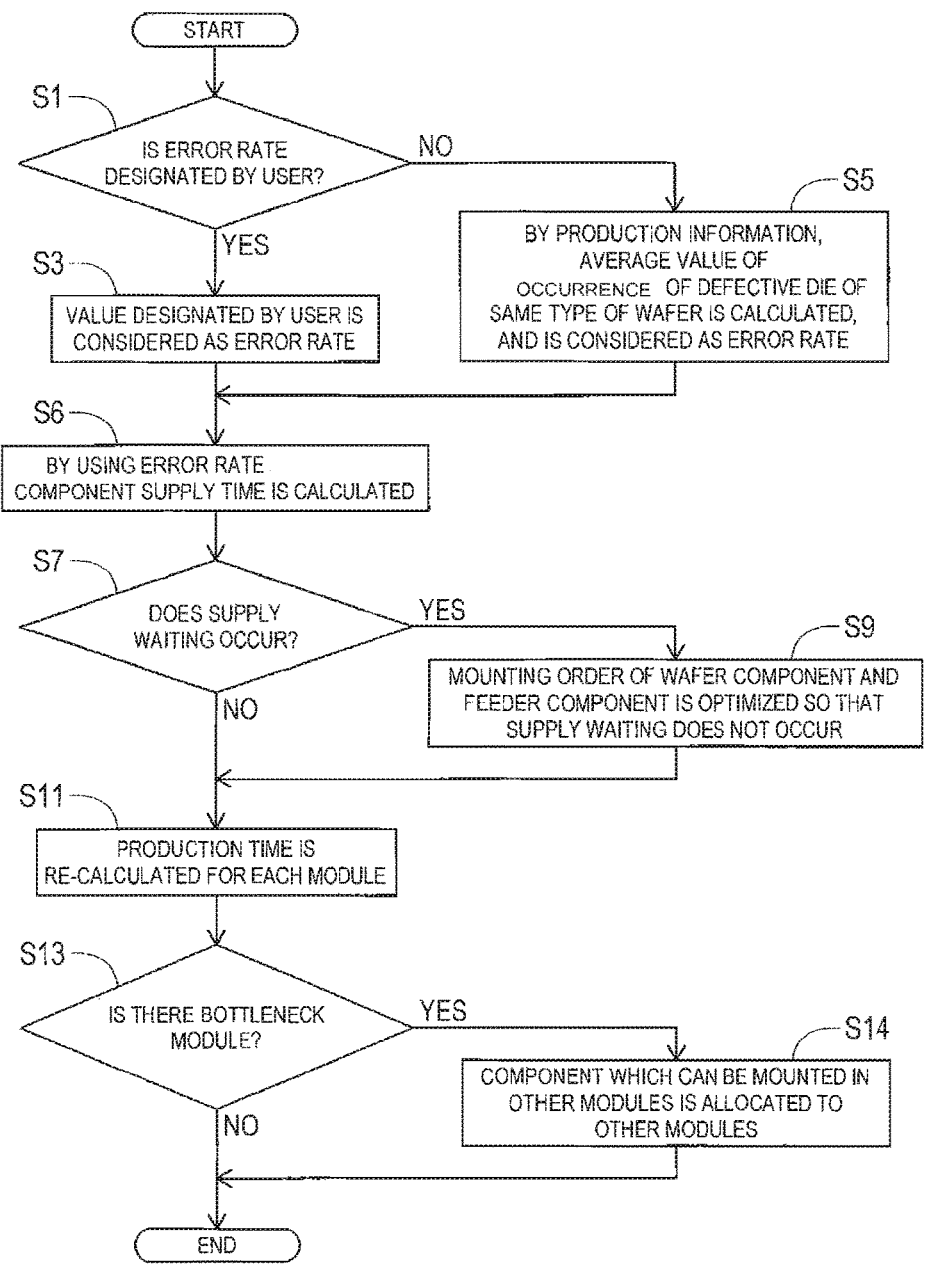
FIG. 6 is a flowchart illustrating optimizing processing of a mounting order of components.

A flow chart illustrated in FIG. 6 illustrates the optimizing processing of mounting order of the components. First, the integrated control device 141 of the system 10 determines whether or not the error rate is designated by the user, before producing the printed circuit board, for example, based on the production job (step S1). For example, in accordance with the displayed content on the display device 143 of the integrated control device 141, the user inputs the error rate of the electronic component mounting machine 17 provided with the wafer-type supply device 82 among the electronic component mounting machines 16 and 17 connected to the component production line of the system 10 using a touch panel of the display device 143. The error rate varies according to the type or the like of the die 108 (wafer). Therefore, the user can set an arbitrary error rate decided based on the result or the like obtained by using the same type of die 108, while managing to drive the system 10.

In a case where the error rate is designated by the user in step S1 (step S1: "YES"), the integrated control device 141 decides the designated value as the error rate (step S3). In addition, in a case where the error rate is not designated by the user (step S1: "NO"), the integrated control device 141 decides a value obtained by averaging the occurrence rates of the defective die of the same type of wafer (die 108) as the error rate, in the wafer used in producing the printed circuit board in the past (step S5).

FIG. 7 illustrates a part of the production information, and the number of defective dies in the wafers used in each producing order of the printed circuit board. The production information, for example, may be integrally managed by the integrated control device 141, or may be managed being stored in the memory 135 by the control device 130 of the electronic component mounting machine 17. As illustrated in FIG. 7, for example, in producing the first printed circuit board, three wafer types, such as "A", "B", and "C", are used. From the viewpoint of producing the first printed circuit board, each of the wafer types "A", "B", and "C" is used one by one. In addition, from the viewpoint of producing the second printed circuit board, in each of the wafer types "A", "B", and "C", two wafers (wafer IDs are "A-00001" and "A-00002") are used as the wafer type "A", and each of the other wafer types "B" and "C" is used one by one. For example, every time of producing the printed circuit board, the electronic component mounting machine 17 provided with the wafer-type supply device 82 totalizes the number of normal dies and the number of defective dies of each wafer type. For example, in producing the first printed circuit board, the wafer type "A" (wafer ID "A-00001") has 5000 normal dies and 10 defective dies in the die 108 which the wafer-type supply device 82 has tried to pick up.

For example, in step S5, when the integrated control device 141 decides the error rate, the production information illustrated in FIG. 8 is totalized. FIG. 8 illustrates the number of normal dies and the number of defective dies of the wafer type "A". For example, in the wafer ID "A-00001", since the number of normal dies is 9900 and the number of the defective dies is 100, the error rate becomes 1%. In addition, in the wafer ID "A-00002", since the number of normal dies is 9999 and the number of defective dies is 1, the error rate becomes 0.01%. The control device 130 of the electronic component mounting machine 17 computes the error rate by adding the number of normal dies and the number of defective dies from the wafer ID "A-00001" to the wafer ID "A-00006" which are the same wafer type, based on the production information illustrated in FIG. 8. As a result of computation, the error rate of the wafer type "A" becomes 2%. Similar to the error rate of the wafer type "A", the control device 130 also computes the error rate with respect to other wafers "B" and "C", and sends the error rate to the integrated control device 141. In addition, the computation of the error rate may be performed by the integrated control device 141.

Optimization of Supply Order of Components

Next, in step S6 illustrated in FIG. 6, the integrated control device 141 decides the error rate of the wafer type which is used in the production job of the printed circuit board to be produced next, based on the error rate decided by the input value of the user or the production information. The integrated control device 141 notifies the decided error rate to the electronic component mounting machine 17 which uses the wafer-type supply device 82 in the next production job. The control device 130 of the electronic component mounting machine 17 which received the notification computes the component supply time based on the error rate.

Next, the control device 130 determines whether or not "supply waiting" in which a delay occurs in the operation of supplying the components by the wafer-type supply device 82 or other component supply devices (tape-type supply device 81 or the like) occurs, until the wafer-type supply device 82 picks up the normal dies, based on the computed component supply time (step S7). The control device 130 changes the order of the supply of the wafer-type supply device 82 or other component supply devices to reduce the supply waiting time, in a case where the supply waiting occurs (step S9). In addition, the integrated control device 141 may integrally perform the computation of the component supply time, the detection of the presence or the absence of the supply waiting time, and the change in order of the supply.

The optimization of the supply order of the components performed in the above-described steps S6 to S9 will be described. FIG. 9 illustrates an example of the supply order of the components in the electronic component mounting machine 17 before the optimization. In the example illustrated in FIG. 9, the electronic component mounting machine 17, first, supplies (the item of the component type in the drawing is a "wafer component" column) the die 108 of the wafer-type supply device 82 5 times, and then, supplies (the item of the component type in the drawing is a "feeder component" column) the electronic component 77 of the tape-type supply device 81 5 times, as a mounting sequence of the components.

Figure 10:
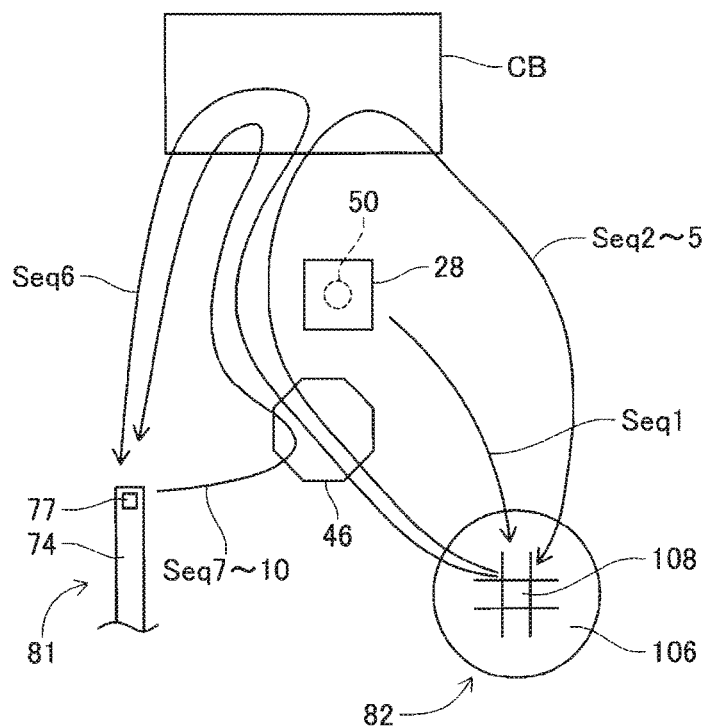
FIG. 10 is a schematic view illustrating a mounting sequence in the electronic component mounting machine.

FIG. 10 is a schematic view illustrating the mounting sequence of the electronic component mounting machine 17. In addition, FIG. 11 illustrates data related to the component supply time stored in the memory 135 of the control device 130, and illustrates data before considering the error rate which corresponds to the mounting sequence illustrated in FIG. 9. In the data illustrated in FIG. 11, data which corresponds to each item, such as the number of mounting sequence (Seq number), a slot number, required supply time which does not consider the error rate, suctioning operation details, a suctioning operation time (operation time), the presence or the absence of the supply waiting occurrence, and the required total time. In addition, in the electronic component mounting machine 17, the plurality of slots to which the wafer-type supply device 82 and the tape-type supply device 81 are connected are provided, but in the following description, as an example, the slot number to which the wafer-type supply device 82 is connected is described as "1", and the slot number to which the tape-type supply device 81 is connected is described as "2". In addition, in the plurality of mounting sequences Seq, the description of similar processing will be appropriately omitted.

First, the control device 130 performs the number 1 (mounting sequence Seq 1) of the mounting sequence together with the start of the mounting sequence illustrated in FIG. 11, and moves the mounting head 28 to the supply position (suctioning position of the mounting head 28) of the wafer-type supply device 82 connected to the slot number 1. As illustrated in the mounting sequence Seq 1 of FIG. 10, the mounting head 28 moves from the waiting position before the work, to the supply position of the wafer-type supply device 82, more specifically, to a part at which the die conveyance table 124 of FIG. 3 is illustrated by a broken line. The suctioning operation time required for moving the mounting head 28 to the suctioning position, becomes, for example, 2 seconds (refer to the item "suctioning operation time" of FIG. 11).

Meanwhile, the wafer-type supply device 82 starts the processing for supplying the die 108 to the supply position together with the start of the production. The required supply time which is required for the wafer-type supply device 82 to supply the die 108 to the supply position, becomes, for example, 2 seconds (refer to the item "required supply time" of FIG. 11). In this case, since the suctioning operation time and the required supply time are the same, the required total time for the mounting sequence Seq 1 becomes 2 seconds.

Next, the control device 130 performs the mounting sequence Seq 2, and performs the work of mounting the die 108 supplied from the wafer-type supply device 82 to the mounting head 28, on a circuit board CB. The control device 130 controls the mounting head 28, and suctions the die 108 of the supply position of the wafer-type supply device 82 by the suction nozzle 50. As illustrated in mounting sequence Seq 2 of FIG. 10, the control device 130 makes the mounting head 28 pass above the part camera 46 from the supply position of the wafer-type supply device 82, and moves the mounting head 28 to the mounting position of the circuit board CB secured to the mounting position by the conveyance device 26 (refer to FIG. 3). When the mounting head 28 passes above the part camera 46, the control device 130 captures an image of the suction nozzle 50 which is in a state where the die 108 is suctioned, by the part camera 46. The control device 130 corrects the error of the holding position or the posture of the die 108 suctioned to the suction nozzle 50, and mounts the die 108 on the circuit board CB with respect to the mounting head 28 after the correction, based on the captured data by the part camera 46. In addition, since the die 108 is also supplied from the wafer-type supply device 82 in the next mounting sequence Seq 3, the control device 130 moves the mounting head 28 to the supply position of the wafer-type supply device 82. The suctioning operation time which is required for a series of operations of the mounting sequence Seq 2, becomes, for example, 2.5 seconds.

Meanwhile, the required supply time for the wafer-type supply device 82 becomes 2 seconds similar to the mounting sequence Seq 1. In a case where one of the suctioning operation time and the required supply time is long, the next mounting sequence cannot be performed even when an operation having short processing time is finished. Therefore, the required total time for the mounting sequence Seq 2 becomes 2.5 seconds by being combined with the suctioning operation time having long processing time. Similarly, the control device 130 performs the mounting sequences Seq 3 to Seq 5 of mounting the die 108 supplied from the wafer-type supply device 82 on the circuit board CB. In addition, in the operation accompanied by the mounting of the components on the circuit board CB similar to the mounting sequence Seq 2, the suctioning operation time varies as the mounting position of the component on the circuit board CB becomes close to or far from the supply position of the component of the wafer-type supply device 82. Therefore, in other mounting sequences Seq 3 to Seq 5 of performing similar processing, the suctioning operation times vary from each other.

Next, in the mounting sequence Seq 6, the control device 130 moves the mounting head 28 in which the mounting of the die 108 on the circuit board CB is finished, to the supply position of the tape-type supply device 81 connected to the slot number 2. Next, the control device 130 performs the mounting sequence Seq 7, and performs work of mounting the electronic component 77 supplied from the tape-type supply device 81 to the mounting head 28 on the circuit board CB. As illustrated in FIG. 10, the mounting head 28 passes above the part camera 46 from the supply position of the tape-type supply device 81, moves to the mounting position on the circuit board CB, and mounts the electronic component 77. Similarly, the control device 130 repeatedly performs the mounting of the electronic component 77 supplied from the tape-type supply device 81 on the circuit board CB in the mounting sequences Seq 8 to Seq 10.

With respect to the data related to the component supply time illustrated in FIG. 11 described above, in step S6 illustrated in FIG. 6, the control device 130 computes the required supply time for the wafer-type supply device 82 based on the error rate which was received with the notification from the integrated control device 141. The control device 130 performs computation by multiplying the error rate and a coefficient set in advance and the required supply time for each mounting sequence. FIG. 12 illustrates data related to the component supply time after the computation based on the error rate. For example, the required supply time for the wafer-type supply device 82 becomes 2.1 seconds from 2 seconds as a result of the computation based on the error rate in which the defective die occurs. In the mounting sequence Seq 1, the required supply time (2.1 seconds) becomes longer than the suctioning operation time (2 seconds). Therefore, the required total time for the mounting sequence Seq 1 becomes 2.1 seconds to which the required supply time having long processing time is employed.

In this manner, when the required supply time is corrected by using the error rate obtained by totalizing and averaging the error rate for each wafer type, in the operation of the mounting sequence Seq 1, it is expected that the supply operation of conveying the die 108 picked up by the wafer-type supply device 82 to the supply position is not completed until the movement of the head moving device 90 is completed. As a result, in the control device 130, a delay occurs at the timing of performing the operation after the next mounting sequence Seq 2. The control device 130 decides that the supply waiting occurs in the mounting sequence in which the required total time is long, as a result of the correction of the required supply time being performed based on the error rate. In the example illustrated in FIG. 12, the mounting sequences Seq 1 and Seq 3 among the mounting sequences Seq 1 to Seq 5 which correspond to the wafer-type supply device 82, correspond thereto. The control device 130 determines that the supply waiting occurs in the mounting sequences Seq 1 and Seq 3 in which the required total time is long, and sets the data illustrating "present" in the item "presence or absence of occurrence of supply waiting".

Next, in step S7 illustrated in FIG. 6, since the supply waiting occurs, the control device 130 changes the order of the supply of the wafer-type supply device 82 and the tape-type supply device 81 so that the supply waiting time is reduced (step S9). FIG. 13 illustrates data after optimizing the data related to the component supply time illustrated in FIG. 12. In addition, in the following description, the number of the mounting sequence before the change will be described being referred to as an old mounting sequence, and the mounting sequence after the change will be described being referred to as a new mounting sequence.

For example, the control device 130 inserts the old mounting sequence Seq 6 of supplying the electronic component 77 from the tape-type supply device 81 (slot 2) before the old mounting sequence Seq 1 in which the supply waiting occurs, as the new mounting sequence Seq 1. The old mounting sequence Seq 1 proceeds in order as the new mounting sequence Seq 2.

In the mounting sequence after the change, the control device 130 performs the new mounting sequence Seq 1 together with the start of the production of the printed circuit board, and moves the mounting head 28 to the supply position of the tape-type supply device 81 connected to the slot number 2. The suctioning operation time required for moving the mounting head 28 to the suctioning position becomes 2 seconds.

Meanwhile, the wafer-type supply device 82 can start the processing for supplying the die 108 to the supply position while the new mounting sequence Seq 1 is performed, that is, while the operation with respect to the other supply devices is performed. The supply time required for the wafer-type supply device 82 to supply the die 108 to the supply position becomes 2.1 seconds when considering the error rate, as described above. However, the wafer-type supply device 82 starts the pick-up operation of the die 108 at the same time when the new mounting sequence Seq 1 starts. Therefore, the required supply time for the wafer-type supply device 82 practically becomes 0.1 seconds obtained by subtracting 2 seconds of the new mounting sequence Seq 1 from 2.1 seconds. As a result, in the new mounting sequence Seq after the change, the required total time for the old mounting sequence Seq 1 is reduced to 2 seconds from 2.1 seconds before the optimization. In addition, the required total time becomes 2 seconds, because the suctioning operation time of the mounting head 28 having long processing time is employed.

Similarly, the control device 130 inserts the old mounting sequence Seq 7 which supplies the electronic component 77 from the tape-type supply device 81 (slot 2) before the old mounting sequence Seq 3 in which the supply waiting occurs, as the new mounting sequence Seq 4. The old mounting sequence Seq 3 proceeds in order as the new mounting sequence Seq 5. Accordingly, the required total time for the new mounting sequence Seq 5 (old mounting sequence Seq 3) after the change is reduced from 2.1 seconds before the optimization to 2 seconds. In addition, the order of the mounting sequence after the optimization illustrated in FIG. 13 is an example, and the disclosure is not limited thereto. In addition, it is preferable that the order of the mounting sequence maintains the original order as long as it is possible except for replacement of the order due to the optimization. Therefore, it is preferable that the control device 130 considers the target of the replacement in the order of early number (for example, old mounting sequences Seq 6 and Seq 7) in the mounting sequence related to the tape-type supply device 81 (other supply devices), similar to data after the optimization illustrated in FIG. 13.

Since the required total time for the new mounting sequences Seq 2 and Seq 5 is optimized to 2 seconds which is the same as the mounting sequences Seq 1 and Seq 3 which do not consider the error rate illustrated in FIG. 11, the control device 130 makes the item "presence or absence of occurrence of supply waiting" illustrated in FIG. 13 become all absent. Accordingly, the control device 130 can optimize the mounting order of the components (the die 108 and the electronic component 77) with respect to the circuit board CB by using more accurate required total time in consideration of delay of the required supply time for the wafer-type supply device 82 by the error rate.

In the electronic component mounting machine 17 of the related art, since the mounting sequence is decided without considering the error rate, in the real work, the required total time for the mounting sequence in the middle of the performance when the defective die is found becomes long, and a defect that the start time of the work after the next mounting sequence is delayed occurs. In addition, as the delay of the required total time occurs, since the start time of the mounting sequence which has not been performed is delayed, the production time of one printed circuit board becomes long, and the production efficiency deteriorates. Meanwhile, in the system 10 of the embodiment, since the control device 130 of the electronic component mounting machine 17 optimizes the required total time by considering the error rate, it is possible to reduce the delay of the required total time due to the defective die as much as possible during the real work. As a result, the system 10 reduces the production time of the printed circuit board, and can achieve effective production efficiency.

Optimization of Module

Next, the integrated control device 141 of the system 10 performs the optimization for each module. As illustrated in FIG. 1, in the system 10, each of four electronic component mounting devices 12 arranged to be adjacent to each other, is provided with two electronic component mounting machines 16 and one electronic component mounting machine 17. The integrated control device 141 manages each of the plural electronic component mounting machines 16 and 17 as a module. In addition, the integrated control device 141 performs the optimization so that the production time (takt time) which becomes necessary when mounting the components on the circuit board CB in each module (electronic component mounting machines 16 and 17) is reduced. In addition, the unit of the module set for managing the production time by the integrated control device 141 can be appropriately changed, and for example, the electronic component mounting device 12 may be managed as a module. In the following description, a case where the integrated control device 141 performs management and processing of optimization by considering one electronic component mounting machine 16 or electronic component mounting machine 17 as one module, will be described.

The integrated control device 141 performs step S11 following step S7 or step S9 illustrated in FIG. 6. The integrated control device 141 computes the production time of each module (electronic component mounting machines 16 and 17). For example, in the component supply time in which the mounting sequence is optimized based on the error rate illustrated in FIG. 13, the production time which becomes necessary for mounting all of the components (the die 108 and the electronic component 77) on the circuit board CB, becomes the time (in this case, 21.5 seconds) obtained by totalizing the required total time for the new mounting sequences Seq 1 to Seq 10.

Next, in step S13, the integrated control device 141 obtains the production time with respect to all of the modules, and determines the module having the longest production time as a module of a bottleneck. In the example illustrated in FIG. 13, since all of the required total times become the same as that of FIG. 11 which is that before considering the error rate, the production time (takt time) does not increase or decrease. However, there is a case where the production time is longer than that before considering the error rate even when performing the optimizing processing in step S9. In this case, a possibility that the electronic component mounting machine 17 (module) provided with the wafer-type supply device 82 becomes bottleneck, occurs. In addition, the increase in the production time means an increase from ideal production time (refer to FIG. 11) without a defective die, and from the production time without a change in the order of the mounting sequence illustrated in FIG. 12, it is needless to say that the production time after the optimization is reduced.

Figure 14:
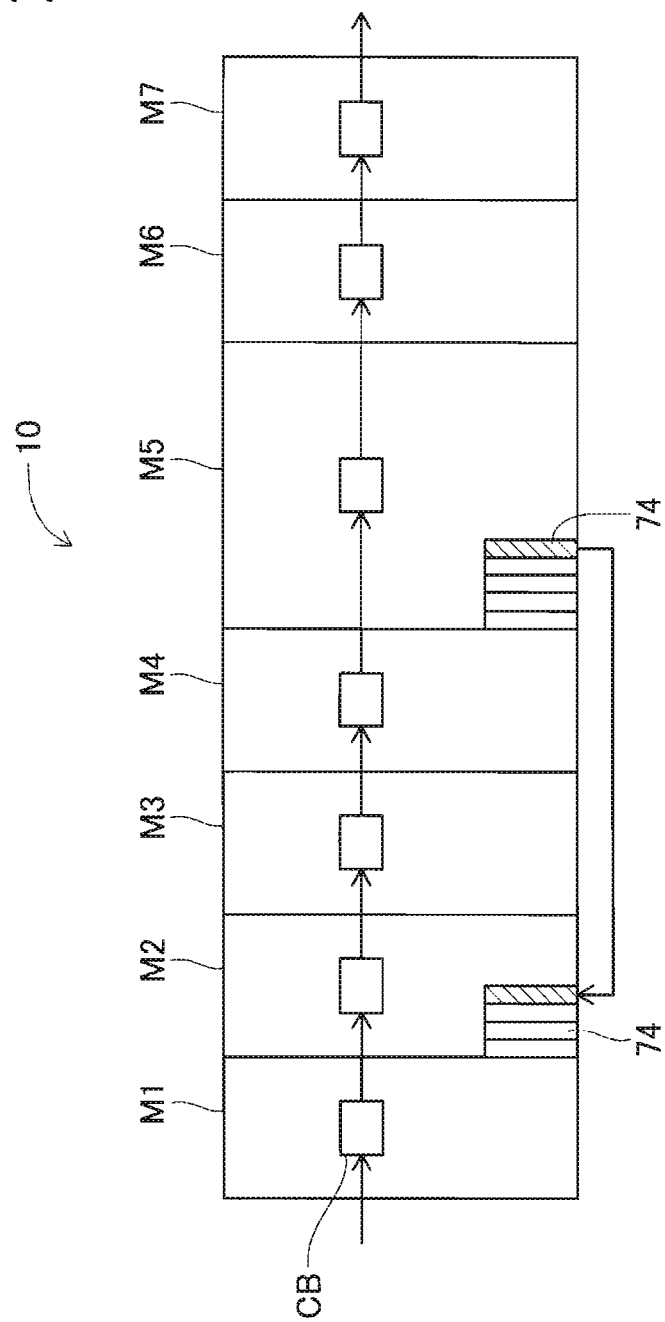
FIG. 14 is a schematic view illustrating modules aligned along a component-mounting line.

In other words, FIG. 14 schematically illustrates electronic component mounting machines 16M1 to 16M4, 16M6, and 16M7, and an electronic component mounting machine 17M5 (hereinafter, M1 to M7 will be referred to as "module") which are aligned along the component-mounting line of the system 10. Here, in the system 10, in a case where the printed circuit board is generated in one component-mounting line in which the modules M1 to M7 are aligned, by reducing each production time of the modules M1 to M7 of the bottleneck, it is possible to improve the production efficiency (throughput) of the entire system 10. For example, FIG. 15 illustrates each production time of the modules M1 to M7. For example, the module M5 is the electronic component mounting machine 17 provided with the wafer-type supply device 82. As illustrated in FIG. 14, each of the modules M1 to M7 performs a predetermined mounting process of mounting the components on the circuit board with respect to the circuit board CB which is conveyed from the upstream side of the component-mounting line, and repeatedly performs the conveying work to the modules M1 to M7 on the downstream side. In order to maintain the quality, the system 10 controls conveyance of the circuit board CB of each of the modules M1 to M7 in accordance with the production time of the module having the longest production time among the modules M1 to M7, that is, the production time of the module of the bottleneck. In other words, the time ("production time of system" in FIG. 15) which is necessary for conveying one printed circuit board produced by the system 10, becomes the production time of the module of the bottleneck. Therefore, in the system 10, by reducing the production time of the modules M1 to M7 of the bottleneck, production efficiency is improved.

As illustrated in FIG. 15, in the module M5, when the optimization based on the error rate is performed, the production time of the wafer-type supply device 82 (the item "wafer component" in the drawing) increases only by 1 second from 8 seconds to 9 seconds. In the modules M1 to M7 after performing the optimization based on the error rate, the production time of the module M5 is 11 seconds, and the production time of other modules M1 to M4, M6, and M7 becomes equal to or less than 10 seconds. Therefore, the module M5 independently becomes a module of a bottleneck.

Since the module M5 becomes a bottleneck as a result of re-computing the production time in step S11 (step S13: "YES"), the integrated control device 141 changes a mounting condition of the module M5 (step S14). For example, the integrated control device 141 changes the disposition of the tape feeder 74 which can be mounted by other modules M1 to M4, M6, and M7 among the plurality of tape feeders 74 mounted on the tape-type supply device 81 of the module M5. The integrated control device 141 determines the disposition destination of the tape feeder 74 based on the mounting process or each production time of other modules M1 to M4, M6, and M7 except for the module M5. For example, the integrated control device 141 notifies the instruction of moving one tape feeder 74 mounted on the module M5 to the module M2 having the shortest production time, to the user. As illustrated in FIG. 15, the production time of the module M5 after changing (optimizing) the disposition of a part of the tape feeders 74 is reduced from 11 seconds to 10 seconds. In addition, the production time of the module M2 increases from 8 seconds to 9 seconds. However, the production time of the modules M1 to M7 is more averaged than that before the optimization, and the production time of the system 10 is reduced from 11 seconds to 10 seconds. In this manner, the integrated control device 141 can improve the production efficiency by changing the disposition of the tape feeder 74.

In addition, the change of the above-described mounting condition is an example, and is appropriately changed. For example, in a case where the electronic component mounting machine 17 is provided with the plurality of wafer-type supply devices 82, or in a case where the electronic component mounting machine 17 is provided with another type of device (tray-type supply device), the system 10 may also achieve the optimization by changing the disposition of the component supplied by any supply device, instead of the tape feeder 74. In addition, the determination condition of whether or not the module of the bottleneck by the integrated control device 141 is present in the above-described step S13, can be appropriately set in accordance with the configuration or the like of the system 10. For example, as described above, in a case where the independent module M5 of bottleneck is present, the integrated control device 141 may determine that "the module of bottleneck is present". In addition, for example, in a case where the number of modules of bottleneck among the modules M1 to M7 is equal to or less than the number set in advance, the integrated control device 141 may determine that "the module of bottleneck is present". In addition, for example, in a case where the production time of the system 10 increases before and after the processing of step S11 (re-computation of the production time), the integrated control device 141 may determine that "the module of bottleneck is present". In addition, for example, in a case where the mounting condition of the modules M1 to M7 of the bottleneck is changed, and the production time of the system can be reduced, the integrated control device 141 may determine that "the module of the bottleneck is present".

Above, according to the first embodiment described in detail, the following effects are achieved.

Effect 1

The electronic component mounting machine 17 provided with the system 10 is provided with the tape-type supply device 81 and the wafer-type supply device 82 as the plurality of component supply sections which supply the components (the electronic component 77 and the die 108) to be mounted on the circuit board CB (refer to FIG. 3). In a case where the user inputs the error rate illustrating the number of defective dies included in the wafer provided in the wafer-type supply device 82, the integrated control device 141 of the system 10 uses the input value in the processing (refer to step S3 of FIG. 6). In addition, in a case where there is not an input from the user, the integrated control device 141 decides the value obtained by averaging the occurrence rate of the defective dies of the same type of wafer (die 108) as the error rate, in the wafer used in the past producing in the production information (step S5). The system 10 decides the mounting order of mounting the component supplied from the tape-type supply device 81 or the wafer-type supply device 82 on the circuit board CB in advance based on the decided error rate, or changes the mounting order after the decision.

Here, in the electronic component mounting machine 17 provided with the above-described plural component supply devices, after more accurately grasping the component supply time of each component supply device, it is possible to reduce the production time by optimizing the mounting order of each component on the circuit board CB. Therefore, according to the system 10 according to the embodiment, it becomes possible to decide an appropriate mounting order of the components by using more accurate component supply time of the wafer-type supply device 82, and it becomes possible to improve the production efficiency.

Effect 2

After computing (step S6) the required supply time for the wafer-type supply device 82 based on the error rate, in the mounting sequence of supplying the die 108 by the wafer-type supply device 82, for example, in the mounting sequence Seq 1 of FIG. 12, the control device 130 of the electronic component mounting machine detects that the supply waiting time which delays the operation of starting the next mounting sequence Seq 2 until the wafer-type supply device 82 supplies the normal die, occurs (step S7). The control device 130 decides the order of the mounting sequences Seq 1 to Seq 10 of supplying the components from the wafer-type supply device 82 and the tape-type supply device 81 so as to reduce the supply waiting time, or appropriately changes the decided order.

For example, as illustrated in FIG. 13, the control device 130 inserts the old mounting sequence Seq 6 of supplying the electronic component 77 from the tape-type supply device 81 before the old mounting sequence Seq 1 in which the supply waiting occurs. In the mounting sequence after the change, while the control device 130 performs the new mounting sequence Seq 1, and moves the mounting head 28 to the supply position of the tape-type supply device 81, the control device 130 drives the wafer-type supply device 82. The wafer-type supply device 82 can start the processing for supplying the die 108 to the supply position, while the new mounting sequence Seq 1 is performed, that is, while the operation with respect to other supply devices is performed. As a result, in the new mounting sequence after the change, the required total time for the old mounting sequence Seq 1 is reduced from 2.1 seconds before the optimization to 2 seconds. Accordingly, the electronic component mounting machine 17 can reduce the sum of the required total time, that is, the production time.

Effect 3

The integrated control device 141 manages each of the plurality of electronic component mounting machines 16 and 17 as a module. The integrated control device 141 corrects the production time of each module which corresponds to the type of the printed circuit board to be produced based on the error rate (step S11). Next, the integrated control device 141 determines the module which becomes the bottleneck having the longest production time among the plurality of modules, based on the production time after the correction (step S13). In addition, the integrated control device 141 changes the mounting condition of the module (for example, module M5) which became the bottleneck (step S14). The integrated control device 141 changes the disposition of the tape feeder 74 which can be mounted on other modules M1 to M4, M6, and M7, among the plurality of tape feeders 74 mounted on the tape-type supply device 81 of the module M5. The production time of the modules M1 to M7 is more averaged than that before the optimization, and the production time of the system 10 is reduced (refer to FIG. 15). Accordingly, the system 10 can improve the production efficiency by the optimization of the disposition of the tape feeder 74.

Second Embodiment

Figure 16:
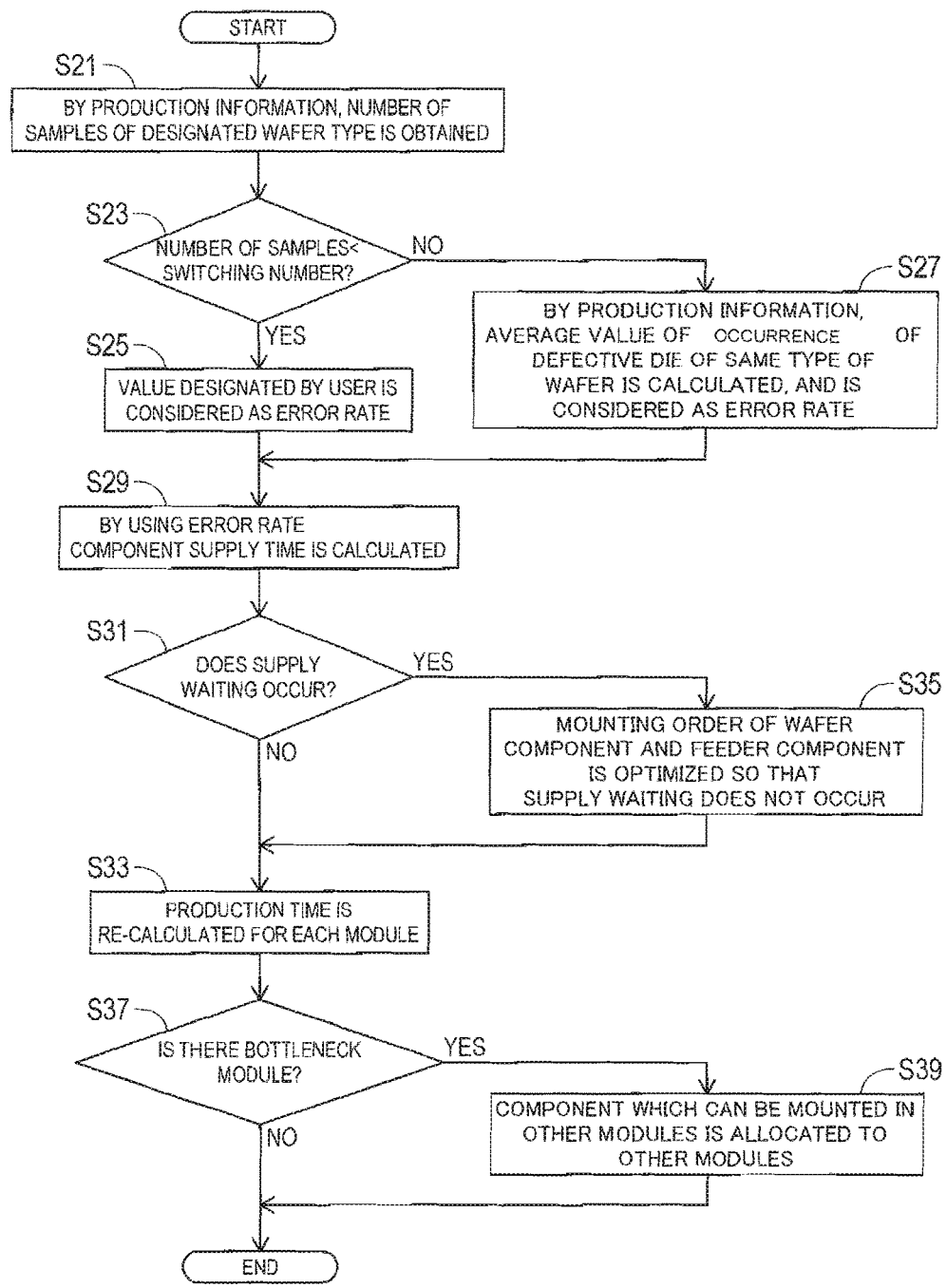
FIG. 16 is a flow chart illustrating optimizing processing of the mounting order of the components of a second embodiment.

Next, a second embodiment which specifies the present disclosure will be described. FIG. 16 is a flow chart of the optimizing processing in the second embodiment. The flow chart of the second embodiment is different from the flow chart illustrated in FIG. 6 of the above-described first embodiment in that the value designated by the user is set as the error rate while the die 108 is used to the switching number designated by the user in advance, and the processing is performed by using the error rate calculated based on the production information after using the die 108 to the switching number. In addition, in the following description, description similar to the processing illustrated in the flow chart of FIG. 6 of the first embodiment, will be appropriately omitted.

First, the integrated control device 141 obtains the number of wafer type samples designated from the production information when producing the printed circuit board based on the production job (step S21 of FIG. 16). For example, the user sets the error rate and the switching number for each wafer type by operating the integrated control device 141, before starting to produce the printed circuit board in the system 10. When the setting operation of the user is finished, the integrated control device 141 resets the number of samples of the production information. Here, the number of samples is referred to as the number of normal dies used in each wafer type, and the number of defective dies of which the use is tried. In addition, the integrated control device 141 performs the processing of the flow chart illustrated in FIG. 16, for example, each time the wafer-type supply device 82 uses one wafer (all of the dies 108). In addition, the integrated control device 141 may perform the processing illustrated in FIG. 16 each time producing one printed circuit board, or producing the predetermined number of printed circuit boards.

FIG. 17 illustrates a part of the production information, and the number of normal dies and the number of defective dies of each wafer ID of the wafer type "A" used in the past. The system 10 including the plurality of electronic component mounting machines 17 uses the wafer of the wafer type "A" in order of wafer ID "A-00001", "A-00002", . . . "A-00007" from the upper side to the lower side of FIG. 17. In the production information illustrated in FIG. 17, when the wafer of wafer ID "A-00001" is used, 10000 dies 108, the total of the numbers of normal dies and the number of defective dies, are used. Therefore, the number of samples obtained from the production information at this point of time, is 10000.

In step S23, the integrated control device 141 compares the number of samples obtained from the production information and the switching number designated by the user. For example, "5000" is assumed as the switching number set by the user. In the integrated control device 141, until all of the dies 108 of the fifth wafer (wafer ID is "A-00005") are used, the number of the dies 108 used, that is, the number of samples does not reach 50000. In addition, the "use" referred here includes a case where the normal die is mounted on the circuit board CB, and a case of the defective dies which have been inspected. Therefore, the integrated control device 141 performs the processing after step S25 since the number of samples is smaller than the switching number until all of the dies 108 of the wafer of the wafer ID "A-00005" are used (step S23: "YES"). In other words, the integrated control device 141 performs the optimization based on the value designated by the user as the error rate until the number of samples becomes greater than the switching number.

Meanwhile, when all of the dies 108 of the wafer of the wafer ID "A-00005" are used, and the number of samples becomes greater than the switching number (step S23: "NO"), the integrated control device 141 performs the processing after step S27. In other words, when the number of samples becomes greater than the switching number, the integrated control device 141 performs the processing of optimization based on the value calculated based on the production information as the error rate. In addition, since the processing of steps S25 to S39 after step S23 illustrated in FIG. 16, are similar to the processing from steps S3 to S14 illustrated in FIG. 6, here, the description thereof will be omitted.

According to the second embodiment described in detail, the following effects are achieved.

Effect

The integrated control device 141 performs the processing of optimization based on the value designated by the user as the error rate until the number of samples becomes greater than the switching number set by the user. In addition, when the number of samples becomes greater than the switching number, the integrated control device 141 performs the processing of optimization based on the value calculated based on the production information as the error rate. Accordingly, in the integrated control device 141, by accumulating the production information until the desirable switching number (number of samples) determined by the user based on the management situation or the like, it is possible to change the error rate at the appropriate timing.

Third Embodiment

Figure 18:
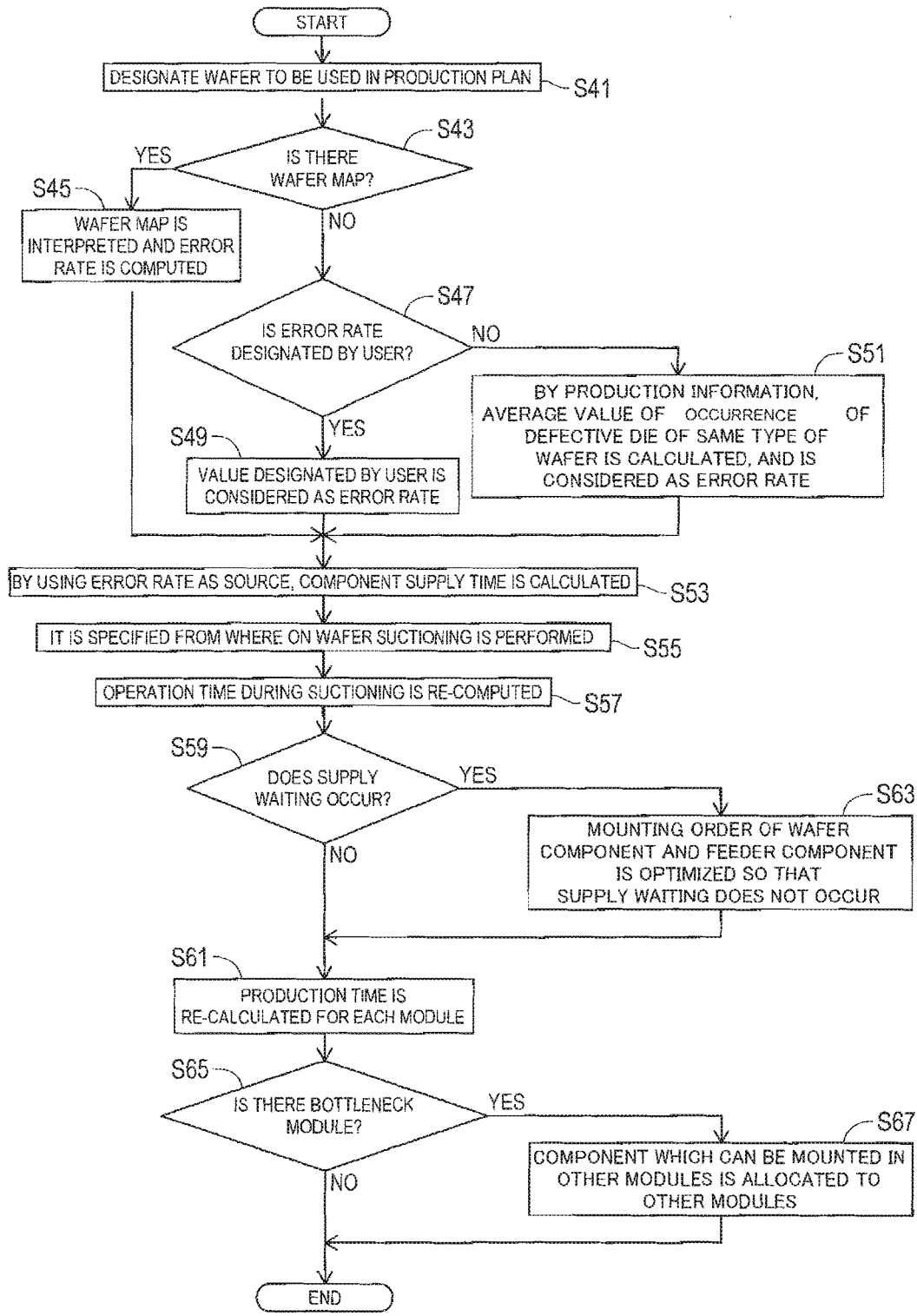
FIG. 18 is a flow chart illustrating optimizing processing of the mounting order of the components of a third embodiment.

Next, a third embodiment which specifies the present disclosure will be described. FIG. 18 is a flow chart of the processing of optimization in the third embodiment. First, the flow chart of the third embodiment is different from the flow chart illustrated in FIG. 6 of the above-described first embodiment in that the processing which uses the wafer map is added. In addition, the second difference is that the time required for supplying the dies 108 is decided according to from which position of the wafer the die 108 is picked up. In addition, in the following description, description similar to the processing illustrated in the flow chart of FIG. 6 of the first embodiment, will be appropriately omitted.

First, the integrated control device 141 specifies the wafer to be used in the production job of the production plan when producing the printed circuit board based on the production job (step S41 of FIG. 18). The integrated control device 141 specifies the electronic component mounting machine 17 which mounts the die 108 on the circuit board CB when producing the printed circuit board, based on the production job. In addition, the integrated control device 141 searches for the ID of the wafer which is planned to be used in producing the printed circuit board from the wafers included in the specified electronic component mounting machine 17. The integrated control device 141 determines whether or not the wafer map which corresponds to the wafer ID of the searching result is present (step S43). In addition, the wafer map referred here is, for example, data illustrating the result of performing the inspection of the normal and defective dies with respect to each die 108 in the die assembly 106 through the arrangement of the dies 108, in the manufacturing process of the wafer. In other words, the wafer map is data illustrating at which position of the die assembly 106 the defective die is disposed. In addition, the integrated control device 141 may not integrally manage the wafer ID included in the electronic component mounting machine 17, and may perform processing of appropriately matching the ID of the wafer which is planned to be used in the electronic component mounting machine 17.

In step S43, in a case where a wafer map which corresponds to the wafer ID to be used (step S43: "YES") is present, the integrated control device 141 computes the error rate based on the data of the wafer map (step S45). The integrated control device 141 interprets the wafer map, detects the number of normal dies and the number of defective dies, and computes the error rate from the detection result. The integrated control device 141 notifies the error rate of the computation result to the electronic component mounting machine 17. The control device 130 of the electronic component mounting machine 17 which receives the notification computes the component supply time based on the error rate (step S53).

In addition, with respect to a case where the corresponding wafer map in the wafer which is planned to be used in the production plan, is not present, the integrated control device 141 performs the processing which uses the error rate (step S49) by the user, or the error rate (step S51) based on the production information. In addition, since the processing of steps S47 to S53 illustrated in FIG. 18, are similar to the processing of steps S1 to S6 illustrated in FIG. 6, the description thereof will be omitted here.

Next, the control device 130 re-computes the time which is required for supplying the die 108 according to from which position of the wafer the die 108 is picked up (step S55, step S57), then determines whether or not the supply waiting occurs based on the computed component supply time (step S59). Here, in the operation of picking up the die 108, the wafer-type supply device 82 receives the die 108 suctioned by the suction nozzle of the pick-up head 88 (refer to FIG. 4) using the shuttle mechanism 92 (refer to FIG. 3), and transfers the die 108 to the predetermined supply position. At this time, the time which is required for moving the pick-up head 88 increases or decreases according to at which position the die 108 to be picked up is present in the die assembly 106 on the dicing sheet. This is because the die 108 of the wafer-type supply device 82 is different from the electronic component 77 of the tape feeder 74 of the tape-type supply device 81, and the position of the component to be picked up changes from time to time. Meanwhile, in step S55, the control device 130 of the embodiment determines from which position of the wafer the die 108 is picked up, for example, based on the number of the dies 108 which are planned to be used in the production plan and the wafer (wafer ID) which is planned to be used. The control device 130 determines the pick-up position based on the arrangement of the dies 108 on the dicing sheet, the order of picking up the die 108 from the die assembly 106, or the position of the die 108 which is started to be used.

The control device 130 corrects the operation time during the suctioning based on the pick-up position determined in step S55 (step S57). For example, the control device 130 sets delay time in moving the pick-up head 88 at each pick-up position, and corrects the time of "required supply time with considering the error rate" of each of the mounting sequences Seq 1 to Seq 10 illustrated in FIG. 12. In addition, in the processing in steps S55 and S57, the pick-up position is individually specified, and the required supply time is corrected by using the moving time of the pick-up head 88 which corresponds to the position, but the disclosure is not limited thereto. For example, an average value of the delay time related to the moving by considering the center of the die assembly 106 on the dicing sheet as all pick-up positions may be set, and the processing of correcting the required supply time may be performed for each wafer by using the average value. In addition, in each of the above-described embodiments, a configuration of picking up the die 108 by the pick-up head 88 is employed, but for example, a configuration of directly suctioning the die 108 on the dicing sheet by the suction nozzle 50 of the mounting head 28 may be employed. In this case, for example, the time for moving the mounting head 28 to pick up the die 108, is corrected in accordance with the pick-up position. In addition, the correction processing which corresponds to the position of the component to be suctioned in this manner, is not limited to the wafer-type supply device 82, and may be employed in other supply devices which displace the position of suctioning the component, for example, the tray-type supply device which supplies the electronic components which are regularly arranged on the tray.

In addition, the control device 130 determines the supply waiting by using the required supply time which is corrected in accordance with the pick-up position (step S59). In addition, since the processing of steps S59 to S67 illustrated in FIG. 18 is similar to the processing of steps S7 to S14 illustrated in FIG. 6, the description thereof will be omitted here.

Above, according to the third embodiment described in detail, the following effects are achieved.

Effect 1

In a case where the wafer map which corresponds to the wafer ID to be used in producing the printed circuit board is present (step S43: "YES"), the integrated control device 141 of the embodiment computes the error rate based on the data of the wafer map. Accordingly, the integrated control device 141 can perform the processing which uses more accurate error rate with respect to the wafer of which the wafer map can be obtained in advance.

Effect 2

The control device 130 re-computes the time which is required for supplying the die 108 according to from which position of the wafer the die 108 is picked up (step S55, step S57). The control device 130 sets the delay time in moving the pick-up head 88 at each pick-up position, and corrects the time of the "required supply time with considering the error rate" of each of the mounting sequences Seq 1 to Seq 10 illustrated in FIG. 12. Accordingly, the control device 130 can perform the optimization of the mounting order which is employed in a practical aspect of the operation of picking up the die 108 by the pick-up head 88.

Fourth Embodiment

Figure 19:
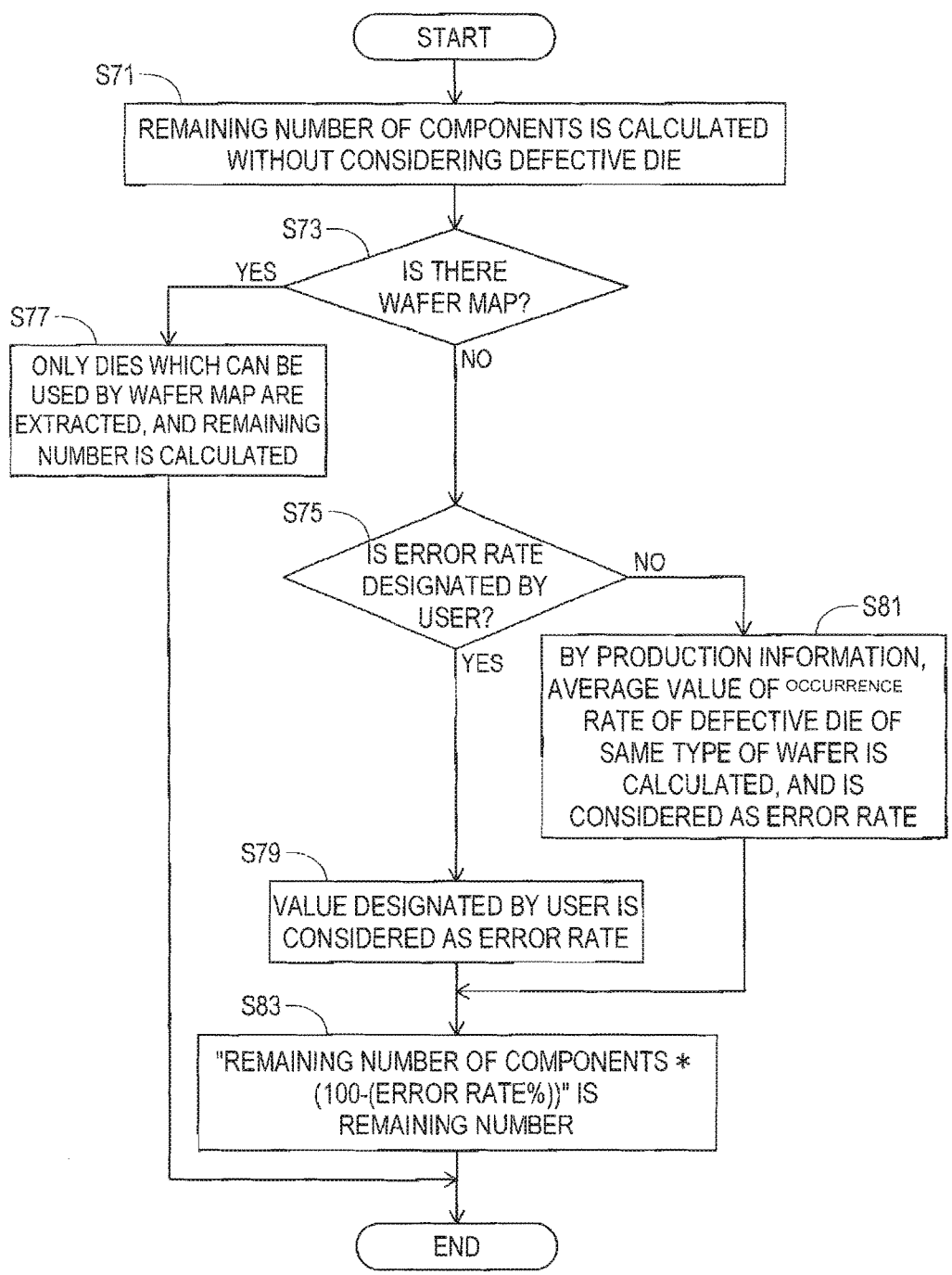
FIG. 19 is a flow chart illustrating processing for deciding the remaining number of components of a fourth embodiment.

Next, a fourth embodiment which specifies the present disclosure will be described. FIG. 19 is a flow chart of the processing of deciding the remaining number of components in the fourth embodiment. When the remaining number of dies 108 of the wafer which is supplied to each wafer-type supply device 82, it is general that the integrated control device 141 or the electronic component mounting device 12 performs the notification or the like which requests the supply to the user. In the remaining number of dies 108 which becomes necessary in the processing, the number of normal remaining dies except for the defective dies, becomes a more appropriate value, in the die assembly 106 remaining on the dicing sheet. Here, the system 10 of the embodiment computes more accurate remaining number of the dies 108 by using the error rate, and changes the timing of notifying the replenishment to the user. In the following description, as an example, a case where the control device 130 of the electronic component mounting machine 17 decides the timing of the replenishment, will be described. In addition, since a case where other devices (integrated control device 141 or the like) of the control device 130 perform the processing, is similar processing, the description thereof will be omitted here.

First, in step S71 illustrated in FIG. 19, the control device 130 computes the remaining number of components without considering the number of defective dies. At the timing when the wafer is replenished to the wafer-type supply device 82, the control device 130 inquires of the integrated control device 141 about the data of the remaining number which corresponds to the replenished wafer ID, and is associated with the data of the remaining number of components and the wafer ID received from the integrated control device 141. Otherwise, the control device 130 searches for whether or not the data of the remaining number of corresponding components is stored in the memory 135 (refer to FIG. 5). Next, the control device 130 determines whether or not the wafer map is present with respect to the wafer in which the remaining number of components is set (step S73). The control device 130 performs the processing of inquiring of the integrated control device 141 about the data of the corresponding wafer map.

In a case where the corresponding wafer map is not present (step S73: "NO"), the control device 130 determines whether or not the error rate is designated by the user with respect to the wafer in which the remaining number of components is set (step S75). In a case where the error rate is designated by the user (step S75: "YES"), the control device 130 considers the designated value as the error rate (step S79). In addition, in a case where the error rate is not designated by the user (step S75: "NO"), the control device 130 considers the value computed based on the data of the wafer type which is the same type as the production information, as the error rate (step S81). In addition, the control device 130 corrects the remaining number of components by using the decided error rate in steps S79 and S81 (step S83).

For example, the remaining number of components after the correction is expressed in the following equation. Remaining number of components after the correction= remaining number of components which has already been set*(100-error rate)

When the remaining number of components which has already been set is 1000, and the error rate is 5°, the remaining number of components after the correction becomes 950. Accordingly, the control device 130 can set accurate remaining number of components by considering the error rate.

In addition, in a case where the corresponding wafer map is present (step S73: "YES"), the control device 130 interprets the wafer map, detects the normal dies, and sets the detected number of normal dies as the remaining number of components after the correction (step S77). In addition, the control device 130 subtracts one from the set remaining number of components after the correction every time the die 108 is supplied to the mounting head 28 from the wafer-type supply device 82 during production of the board, and notifies the replenishment of the wafer to the user when the value after the subtraction becomes a threshold value set in advance.

Above, according to the fourth embodiment described in detail, the following effects are achieved.

Effect 1

The control device 130 corrects the remaining number of components of the dies 108 of the wafer supplied to the wafer-type supply device 82, based on the error rate (step S83). In addition, the control device 130 decides the timing of replenishing the wafer to the wafer-type supply device 82 by using the corrected remaining number of components. Accordingly, since the remaining number of components is corrected by using the error rate, the control device 130 can use more accurate remaining number of components except for the number of defective dies from the remaining number of components set in advance, in the processing. Therefore, since the control device 130 determines the remaining number of components by using more accurate value, the control device 130 can notify the replenishment of the wafer to the wafer-type supply device 82 at more appropriate timing, to the user.

In addition, the present disclosure is not limited to each of the above-described embodiments, and it is needless to say that various improvements and changes are possible without departing from the purpose of the present disclosure. For example, the timing of computing the error rate in each of the embodiments is an example, and can be appropriately changed. For example, in the above-described second embodiment, the integrated control device 141 determines the timing of calculating the error rate from the production information by comparing the number of components (number of samples) used in the production, and the switching number set in advance by the user, but the disclosure is not limited thereto. For example, the integrated control device 141 may set the number of printed circuit boards to be produced as the switching number in advance by the user, and may calculate the error rate at the point of time when the production of only this number of printed circuit boards is finished. Otherwise, the integrated control device 141 may be configured to set the timing at which the predetermined time elapsed from the start of the production of the printed circuit board, as the timing of calculating the error rate.

In addition, in each of the above-described embodiments, although not being particularly mentioned, for example, there is a case where the control device 130 determines that the die 108 cannot be mounted from the image data of the part camera 46 in a case where the suctioning position is largely offset, and the suctioned die 108 is set to be wasted, in the suctioning operation of the die 108 by the suction nozzle 50 of the mounting head 28. In this case, there is a case where the die 108 is wasted according to the quality of the suctioning position even if the die 108 is the normal die, and it becomes necessary that the mounting head 28 picks up the die 108 again. In a case where the offset of the suctioning position occurs in an arbitrary mounting sequence, similar to the defective die, a delay in starting the next mounting sequence occurs. Meanwhile, in a case where the waste of the components (the die 108 or the electronic component 77) due to the offset of the mounting position, occurs, and an operation to pick up a similar component again is performed, a configuration of optimizing by replacing the mounting sequence may be employed. According to the system 10, even in a case where the supply waiting occurs due to the wasting operation, it becomes possible to cope with the supply waiting by performing the processing of optimization.

In addition, in each of the above-described embodiments, the electronic component mounting machine 17 in which the width in the X direction is 2 times that of the electronic component mounting machine 16, is provided with the wafer-type supply device 82 and the tape-type supply device 81, but the electronic component mounting machine 16 may be provided with the wafer-type supply device 82 and the tape-type supply device 81. In addition, in each of the embodiments, the electronic component mounting device 12 and the electronic component mounting machines 16 and 17 may be provided with other types of supply devices of the tape-type supply device 81 and the wafer-type supply device 82, for example, the tray-type supply device. In this case, it is preferable that the system 10 performs the optimization of the mounting order including the tray-type supply device. In addition, in each of the above-described embodiments, the electronic component mounting machine 17 may be configured to be provided with the plurality of wafer-type supply devices 82, and may perform the optimization of the mounting order in the plurality of wafer-type supply devices 82.

In addition, in each of the above-described embodiments, in the operation of picking up the die 108, the die 108 suctioned by the suction nozzle of the pick-up head 88 of the wafer-type supply device 82 is received by the shuttle mechanism 92 and transferred to the predetermined supply position, and at this supply position, the die 108 is delivered to the suction nozzle 50 of the mounting head 28, but the disclosure is not limited to this configuration. For example, a configuration in which a suction head of the pick-up head 88 of the wafer-type supply device 82 is vertically reversed, the die 108 is oriented upward, and the die 108 is delivered to the suction nozzle 50 of the mounting head 28, may be employed. In addition, for example, a configuration in which the die 108 on the dicing sheet is directly suctioned by the suction nozzle 50 of the mounting head 28, may be employed. In this case, the mounting head 28 functions as a part of the die supply section in the disclosure.

In other words, the integrated control device 141 and the control device 130 of the electronic component mounting machine 17 are an example of the control section. The wafer-type supply device 82 is an example of the die supply section. The die 108 and the electronic component 77 are an example of the component. The tape-type supply device 81 is an example of the component supply section. The time of accumulating the production information in the past in the first embodiment, or the time of accumulating the production information using the switching number in the second embodiment, is an example of the predetermined period in the production of the circuit board. The value input by the user is an example of the data related to the defective dies included in the wafer.

REFERENCE SIGNS LIST

10: board work system (system), 16, 17: electronic component mounting machine, 77: electronic component, 81: tape-type supply device, 82: wafer-type supply device, 108: die, 141: integrated control device, Seq 1 to Seq 10: mounting sequence, CB: circuit board, M1 to M5: module

The invention claimed is:

1. A board work system comprising:
a plurality of component supply sections which supply components to be mounted on a circuit board;
a die supply section which is one of the plurality of component supply sections, and supplies dies from a diced wafer; and
a control section which decides or changes a mounting order of mounting the components including the dies on the circuit board, based on an error occurrence rate determined by dividing a number of defective dies on the diced wafer which the die supply section supplies within a predetermined period during production of a plurality of circuit boards by a sum of a number of normal dies on the diced wafer and the number of defective dies.

2. The board work system according to claim 1,
wherein the control section decides or changes an order of supply of the plurality of component supply sections including the die supply section so as to reduce supply waiting time during which an operation of starting a next mounting sequence is delayed until the die supply section supplies a normal die, in a mounting sequence in which the die supply section supplies the dies.

3. The board work system according to claim 1,
wherein the control section manages each production time of a plurality of modules which mount the components supplied from the component supply section on the circuit board, corrects each production time of the plurality of modules which correspond to a type of a component mounting circuit board to be produced, based on the error occurrence rate, determines a module which becomes a bottleneck among the plurality of modules based on the production time after a correction, and changes the type of the component to be supplied in each of the plurality of modules based on the determination result.

4. The board work system according to claim 1,
wherein data related to the defective dies is a wafer map illustrating a position of a defective die in the wafer, and
wherein the control section decides the error occurrence rate also based on the wafer map.

5. The board work system according to claim 1,
wherein the control section decides a time which becomes necessary for supplying a die in accordance with a position of picking up the die in the wafer.

6. The board work system according to claim 1,
wherein the control section computes a remaining number of the dies of the wafer supplied to the die supply section based on the error occurrence rate, and decides timing of replenishing the wafer to the die supply section based on the computation result.

7. A method for managing a mounting order of a component in a board work system including a plurality of component supply sections which supply components to be mounted on a circuit board; and a die supply section which is one of the plurality of component supply sections, and supplies dies from a diced wafer, the method comprising:
deciding or changing a mounting order of mounting the components including the dies on the circuit board, based on an error occurrence rate determined by dividing a number of defective dies on the diced wafer which the die supply section supplies within a predetermined period during production of a plurality of circuit boards by a sum of a number of normal dies on the diced wafer and the number of defective dies.

8. The board work system according to claim 1,
wherein the control section decides or changes a mounting order of mounting the components by alternating between die supply section and another of the plurality of component supply sections based on the error occurrence rate.

9. A board work system comprising:
a plurality of component supply sections which supply components to be mounted on a circuit board;
a die supply section which is one of the plurality of component supply sections, and supplies a die from a diced wafer to a supply position;
a mounting head which is moved to the supply position to suction the die; and
a control section which computes a required supply time which is required for the die supply section to supply the die to the supply position, based on an error occurrence rate determined at least one of division of a number of defective dies on the diced wafer which the die supply section supplies within a predetermined period during production of a plurality of circuit boards by a sum of a number of normal dies on the diced wafer and the number of defective dies and data related to the defective dies included in the wafer, determines whether the die supply section completes conveying the die to the supply position until the mounting head moves to the supply position based on the computed required supply time, and, if determining that the die supply section does not complete, decides or changes a mounting order of mounting the components including the dies on the circuit board.

* * * * *